(12) United States Patent
Lee et al.

(10) Patent No.: US 9,335,624 B2
(45) Date of Patent: May 10, 2016

(54) MULTI-PATTERNING SYSTEM AND METHOD USING PRE-COLORING OR LOCKED PATTERNS

(71) Applicant: Taiwan Semiconductor Manufacturing Co., Ltd., Hsin-Chu (TW)

(72) Inventors: Hui Yu Lee, Hsin-Chu (TW); Chi-Wen Chang, Yuanlin Township (TW); Chih Ming Yang, Hsinchu (TW); Ya Yun Liu, Jhubei (TW); Yi-Kan Cheng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 72 days.

(21) Appl. No.: 14/277,108

(22) Filed: May 14, 2014

(65) Prior Publication Data

US 2015/0121317 A1 Apr. 30, 2015

Related U.S. Application Data

(60) Provisional application No. 61/897,239, filed on Oct. 30, 2013.

(51) Int. Cl.
*G06F 17/50* (2006.01)
*G03F 1/00* (2012.01)

(52) U.S. Cl.
CPC .............. *G03F 1/00* (2013.01); *G06F 17/5068* (2013.01); *G03F 1/144* (2013.01); *G06F 17/5081* (2013.01)

(58) Field of Classification Search
CPC .. G06F 17/5068; G06F 17/5081; G03F 1/144

USPC ....................................................... 716/50–56
See application file for complete search history.

(56) References Cited

U.S. PATENT DOCUMENTS

| 7,062,732 | B2 * | 6/2006 | Ito ....................... | G06F 17/5068 716/122 |
|---|---|---|---|---|
| 2012/0266110 | A1 * | 10/2012 | Cao ........................ | G06F 17/50 716/52 |
| 2013/0061186 | A1 * | 3/2013 | Hsu ........................... | G03F 1/70 716/55 |
| 2013/0191793 | A1 * | 7/2013 | Cao ........................ | G06F 17/50 716/52 |
| 2013/0254726 | A1 * | 9/2013 | Hsu ........................... | G03F 1/70 716/53 |

* cited by examiner

*Primary Examiner* — Stacy Whitmore
(74) *Attorney, Agent, or Firm* — Duane Morris LLP; Steven E. Koffs

(57) ABSTRACT

A non-transitory, computer readable storage medium is encoded with computer program instructions, such that, when the computer program instructions are executed by a computer, the computer performs a method. The method generates mask assignment information for forming a plurality of patterns on a layer of an integrated circuit (IC) by multipatterning. The mask assignment information includes, for each of the plurality of patterns, a mask assignment identifying which of a plurality of masks is to be used to form that pattern, and a mask assignment lock state for that pattern. User inputs setting the mask assignment of at least one of the plurality of patterns, and its mask assignment lock state are received. A new mask assignment is generated for each of the plurality of patterns having an "unlocked" mask assignment lock state.

19 Claims, 19 Drawing Sheets

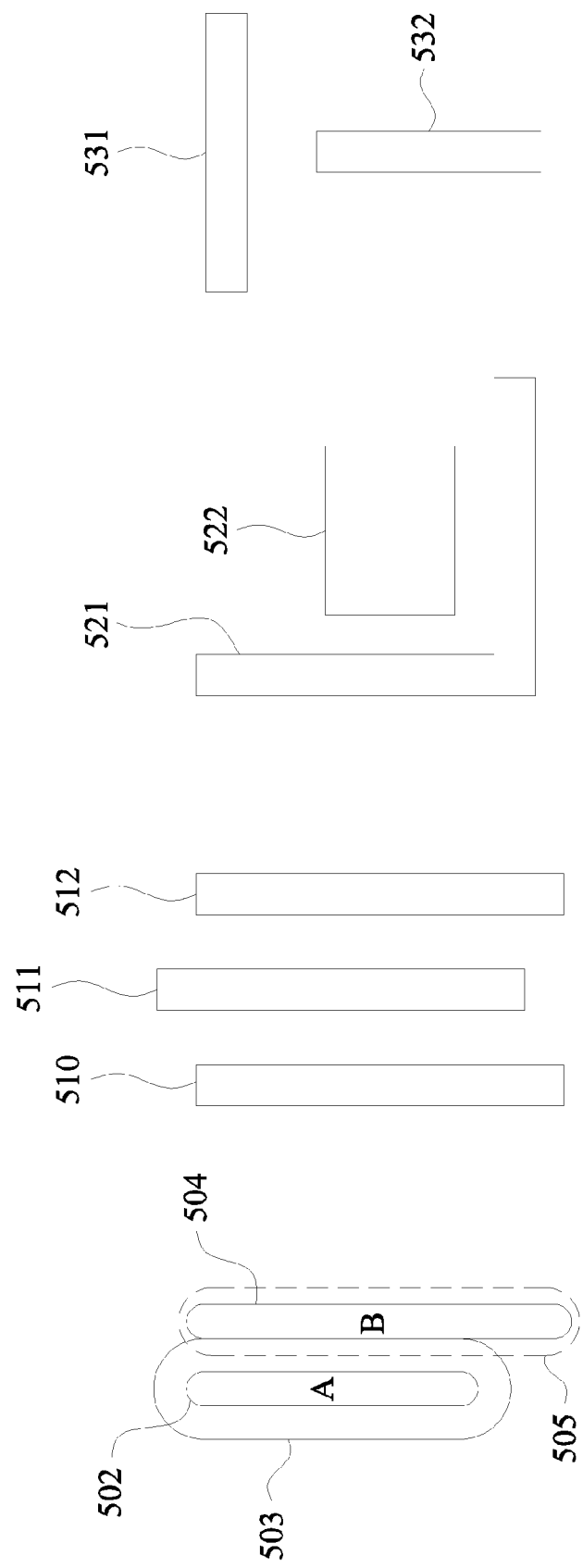

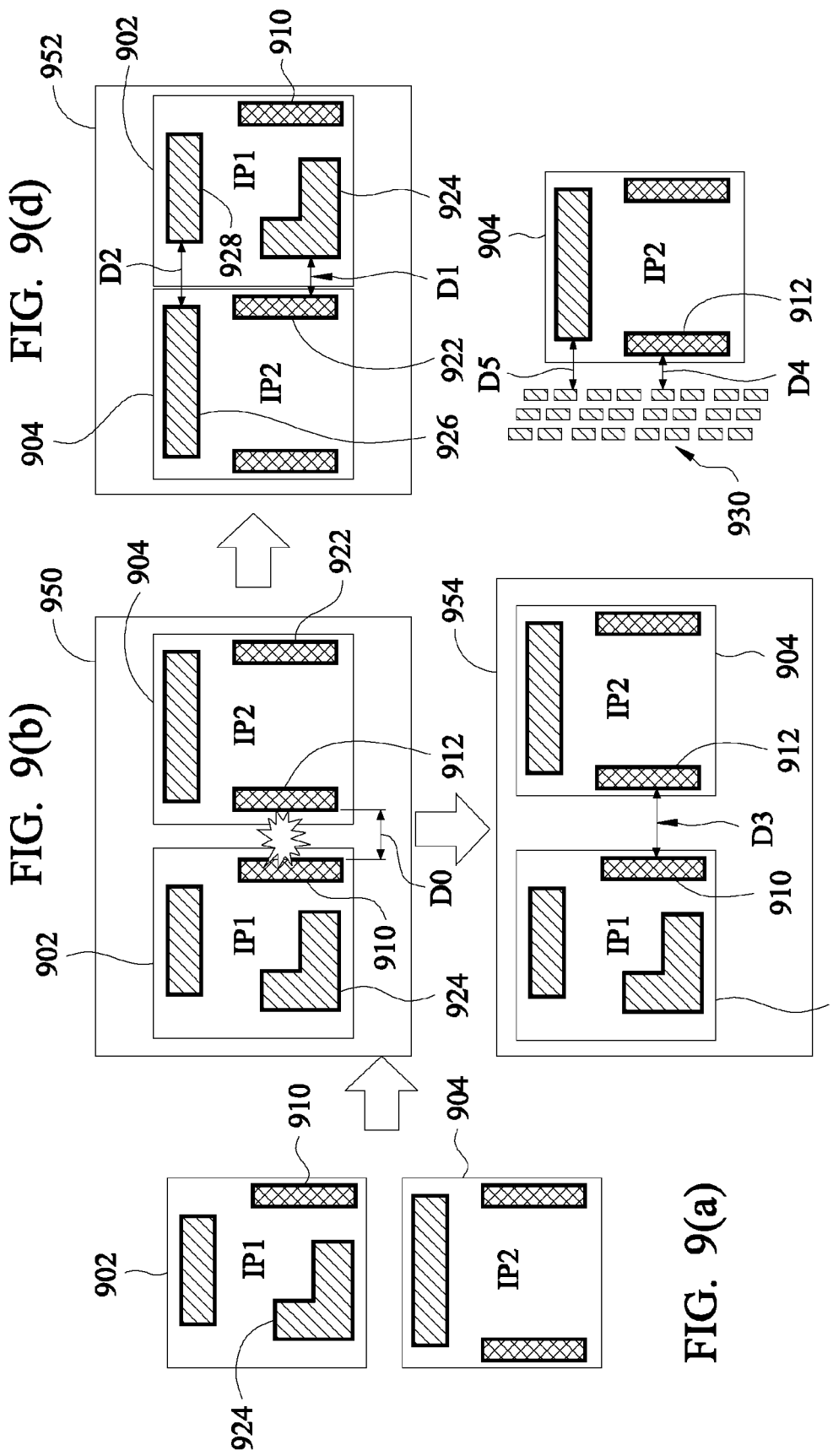

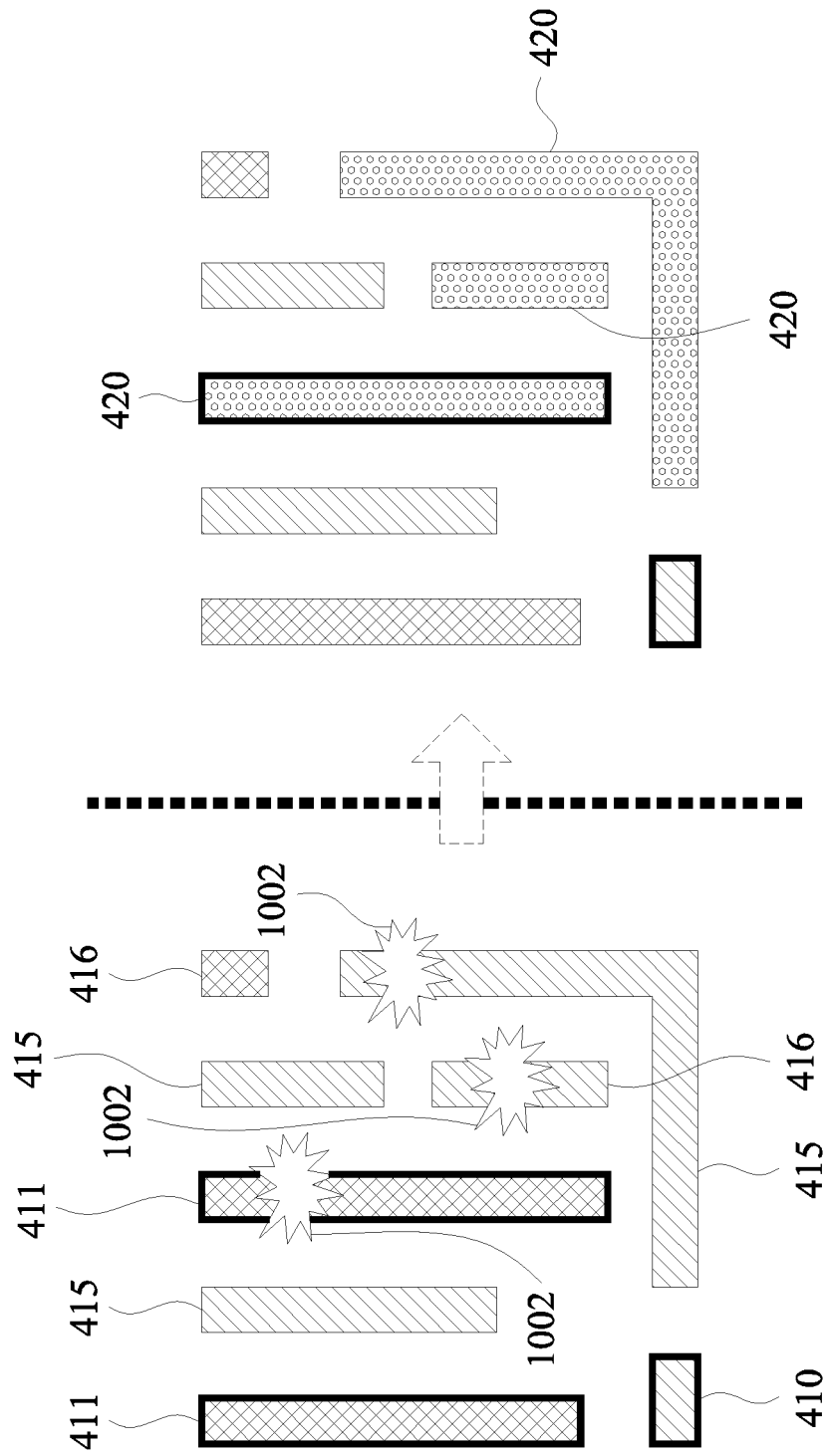

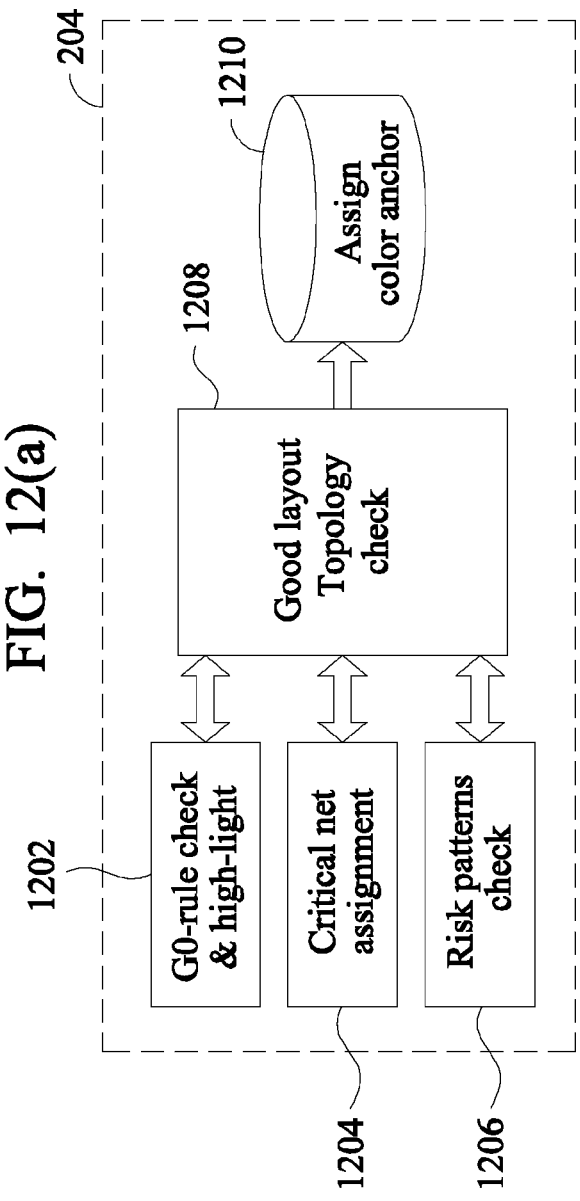
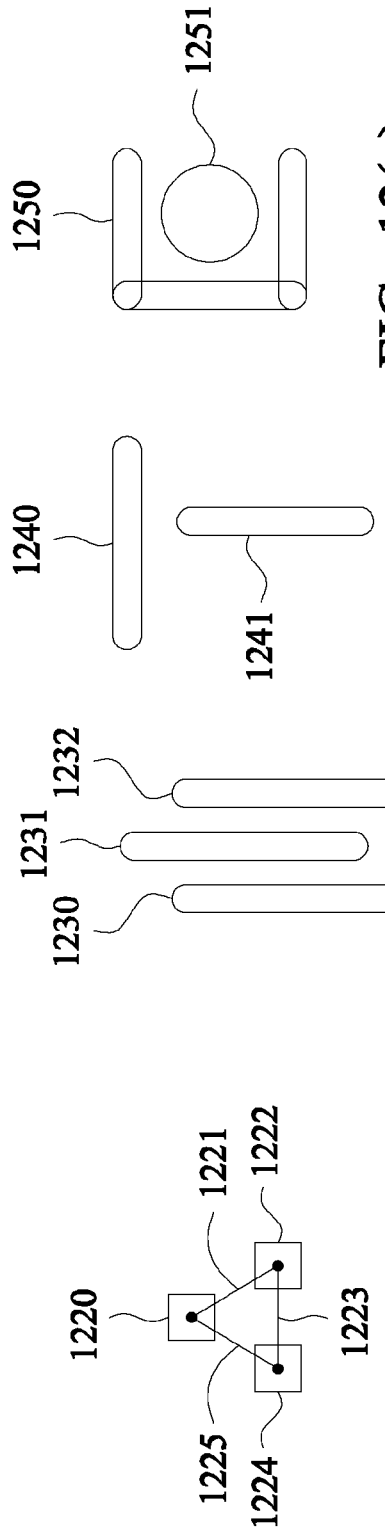
FIG. 12(a)
FIG. 12(b)
FIG. 12(c)
FIG. 12(d)
FIG. 12(e)

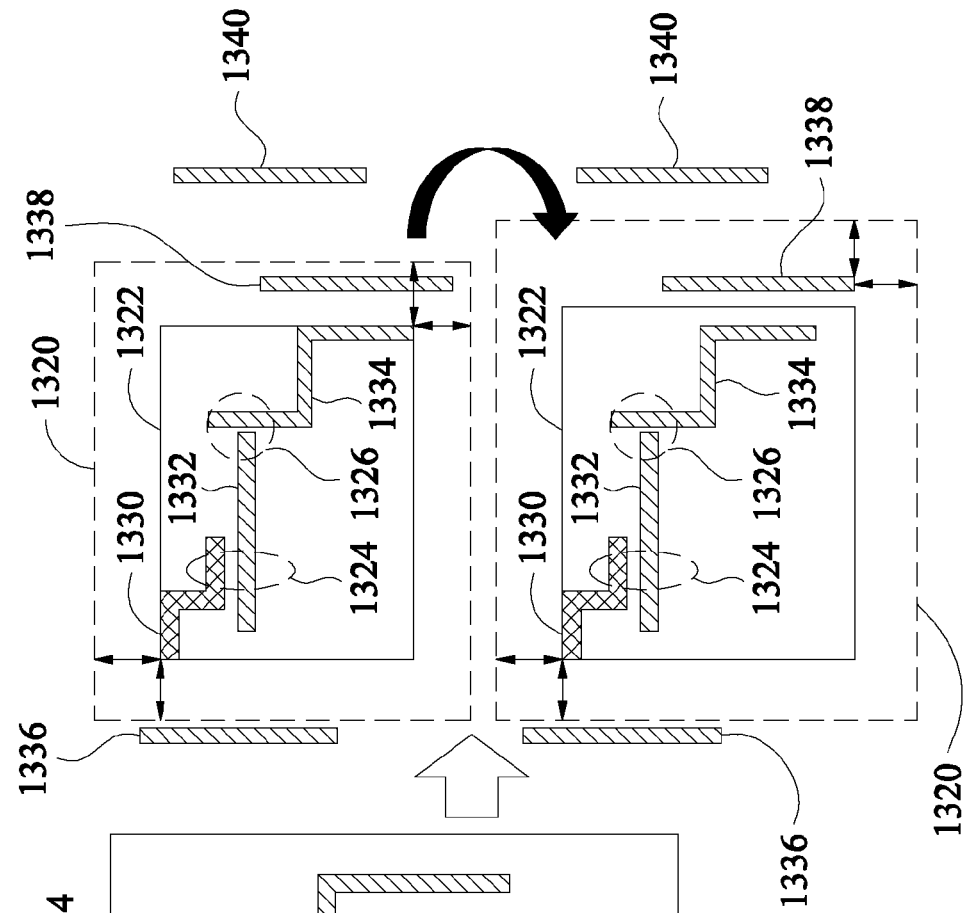
FIG. 13(a)
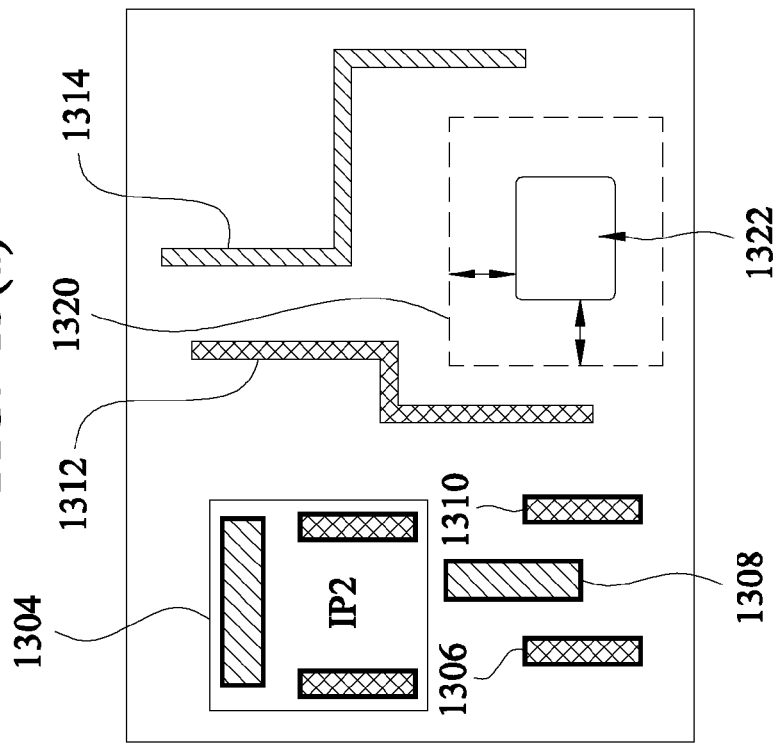
FIG. 13(b)
FIG. 13(c)

MULTI-PATTERNING SYSTEM AND METHOD USING PRE-COLORING OR LOCKED PATTERNS

PRIORITY CLAIM AND CROSS-REFERENCE

This application claims the benefit of priority of U.S. Provisional Patent Application No. 61/897,239, filed Oct. 30, 2013, which is incorporated by reference herein in its entirety.

BACKGROUND

This disclosure relates to semiconductor integrated circuit (IC) fabrication generally, and more specifically to multipatterning techniques. In semiconductor fabrication processes, the resolution of a photoresist pattern begins to blur at about 45 nanometer (nm) half pitch due to diffraction. To continue to use fabrication equipment purchased for larger technology nodes, multi-exposure methods have been developed.

Multiple exposure or multi-patterning technology (MPT) involves forming patterns on a single layer of a substrate using two or more different masks in succession. If only two masks are used for patterning a layer, the technique is referred to as double exposure. One form of double exposure is referred to as double patterning technology (DPT). In DPT, first and second masks are used sequentially to pattern the same layer. As long as the patterns within each mask comply with the relevant minimum separation distances for the technology node, the combination of patterns formed using both masks may include smaller separations than the minimum separation distance. MPT allows line segments, and in some cases, more complex shapes to be formed of a vertical segment and a horizontal segment on the same mask. Thus, MPT provides flexibility and generally allows for significant reduction in overall IC layout. If two or more masks are to be used, it is customary to refer to the patterns as being assigned one of two "color types", where the color corresponds to a mask assignment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5(a) is a diagram showing an effect from using different processes for multipatterning the same layer of an IC, in accordance with some embodiments.

FIGS. 5(b) to 5(d) are diagrams of pattern configurations for which assignment of particular patterns to particular masks is expected to provide better yield or performance, in accordance with some embodiments.

FIGS. 9(a) to 9(e) are schematic diagrams showing how placement and dummy insertion are performed in a color aware prototyping method, in accordance with some embodiments.

FIGS. 10(a) and 10(b) show a method of handling DRC violations within an IP block, if detected during color aware prototyping, in accordance with some embodiments.

FIGS. 12(a) to 12(e) show the assistive functions automatically performed by the method and system during the partial color assignment step of FIG. 11, in accordance with some embodiments.

FIGS. 13(a) to 13(c) show how the method and system isolate a modified pattern for generating new mask assignments, while permitting reuse of mask assignment information remote from the modified pattern, in accordance with some embodiments.

DETAILED DESCRIPTION

Figure 1:
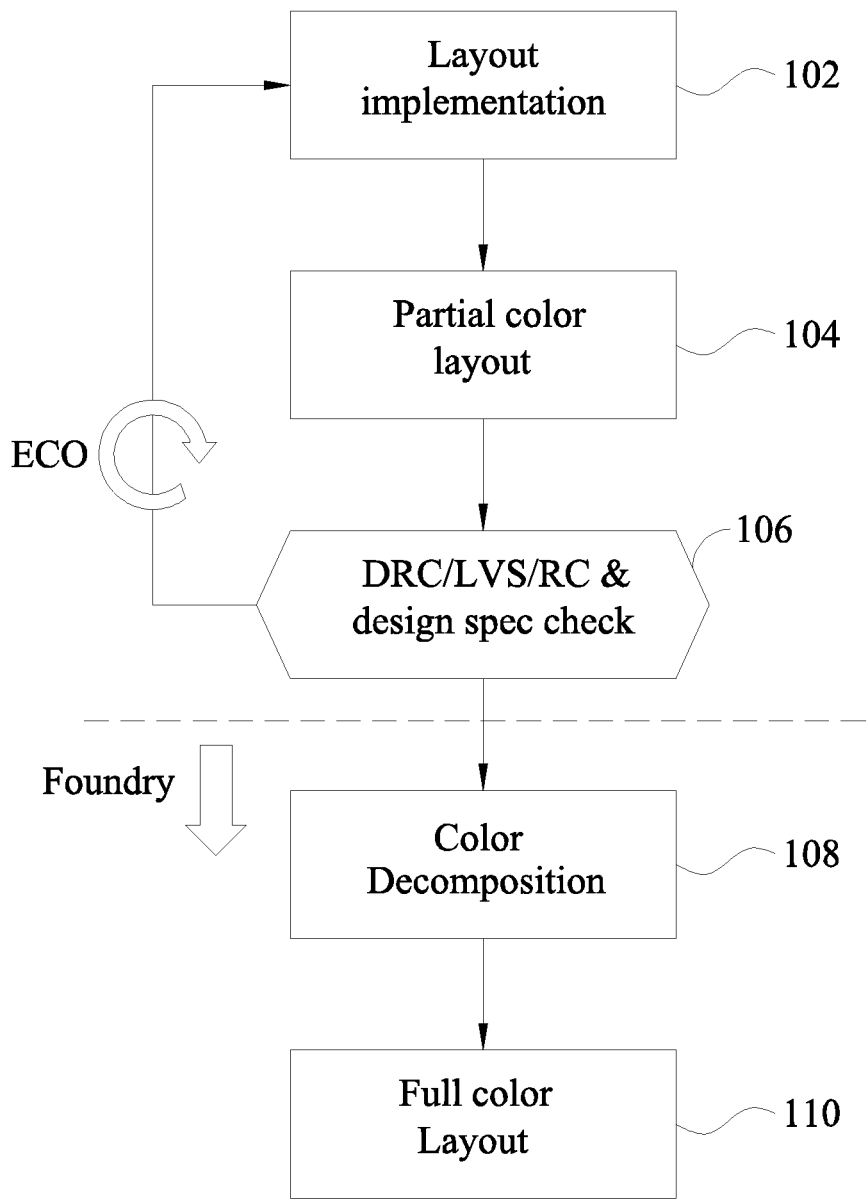
FIG. 1 is a flow chart of a method, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure describes a design flow for full coloring (mask assignment) in multipatterning technology (MPT) with diverse processes. Full coloring allows a designer to select which mask (and corresponding process) will be used to form each individual circuit pattern on a given layer of an integrated circuit (IC). The designer can thus assign circuit patterns which are less tolerant of process variations to a mask (and process) that minimizes the effects of process variations.

As used herein, the term "pattern" can refer without limitation to a circuit pattern, which is part of an interconnect conductive line layer, or a part of an active device layer pattern, such as a gate electrode pattern.

For the 10 nm technology node and other advanced process, double patterning techniques (DPT) or other multipatterning (MPT) with layout full coloring can be used for physical layout implementation. In these advanced technologies, different processes are used to pattern the same layer of a semiconductor substrate using a first mask and a second mask. The different processes can result in different line widths, lines spacings, line depth, and variation, resulting in variations in parasitic capacitances (RC variation). For example, in a self-aligned double patterning (SADP) method a first mask (mask A, which can be a photomask) is used to pattern a photoresist to form a subset of the circuit patterns on a given layer of the substrate (such as a metal interconnect layer, M1). A conformal layer of a spacer material (e.g., SiN or the like) is applied and planarized to form spacers abutting the mask A patterns. The spacers abutting the mask A patterns are then used as a hard mask for forming the mask B patterns.

In an SADP process, the B patterns are formed using the hard mask, without a second photomask. Hereinafter, patterns formed by the first process using the photomask are referred to as "A patterns" and the patterns formed by the second process are referred to as "B Patterns". Although an example is described herein for an SADP process, the methods can be used with other types of process for multipatterning using two or more processes.

Because the A patterns and B patterns are formed by different processes, the A and B patterns can have different line widths and different variations from each other. Also, the B patterns become sensitive to the location and variance of the spacer patterns. When the nominal design spacing between the A patterns and B patterns is small, the spacers forming the hard mask can encroach into the B patterns, causing variation in B pattern line width, and in some cases, open circuits. Thus, the A patterns can be formed independently of how closely the B patterns are located, but proper formation of the B patterns is dependent on the distance from adjacent A patterns. The patterning processes are "asymmetrical." When two or more processes are used for multipatterning, correct patterning can depend on ensuring that certain particular patterns are assigned to the A mask, and not the B mask.

Thus, improved results can be achieved when the assignment of the patterns to mask A or mask B is performed at the design stage, prior to releasing the layout to the foundry. In some embodiments, a full color layout implementation is used for N10 and smaller technologies. A full color layout implementation is different from the partial coloring methodology used in N20/N16 technology nodes.

Good coloring methods and design flow can reduce layout implementation and engineering change order (ECO) efforts significantly.

An effective method is described herein to reduce or eliminate resistance-capacitance (RC) impact and to reduce color assignment iteration. Herein, the term "color" refers to mask, and color assignment refers to assignment of a pattern to a mask and its corresponding process.

FIG. 1 is a flow diagram of a partial coloring method according to some embodiments. For technology nodes such as N20/N16 DPT, users are allowed to use partial color methodology to create a physical layout.

At step 102, the place and route engine of a computer implemented electronic design automation (EDA) tool generates a preliminary layout of a layer of the IC, based on a netlist representation of the layer. The preliminary layout can be a GDSII representation, for example.

At step 104, the designer adds partial coloring information to the layout data. In partial coloring, a designer can select a group of patterns (e.g., a timing critical network) to be assigned to the same mask. The designer may not care whether the network is all assigned to mask A or all assigned to mask B, as the same results can be achieved either way. By assigning all of the patterns in the time critical network to the same mask, the spacing (and capacitive couplings) between them can be controlled, regardless of process variations and misalignments between the A and B masks.

In partial coloring, the designer can select patterns to be grouped on the same mask, without specifying which mask. Partial coloring is effective when both masks use the same process to form their respective patterns formed. For example, partial coloring can be used when the A and B masks are both photomasks, in a process referred to as a litho-etch-litho-etch (LELE) process.

At step 106, the design rule checks (DRC) and layout-versus-schematic (LVS) checks are executed with partial coloring of the GDS layout data. The DRC and LVS are based on geometry considerations (spacing between adjacent patterns), without knowledge of the final mask assignments of the patterns. The RC extraction (RCX) is performed, and is not affected by whether the group of patterns are assigned to mask A or mask B, and will not have different R variation or C variation based on the mask assignment.

At step 108, in a partial coloring methodology, the color decomposition and full color GDS are completed at the last stage, typically by the foundry. This occurs after the DRC/LVS/RCX is performed.

At step 110, the EDA tool stores a fully colored layout, including all patterns assigned to respective masks, in a non-transitory, machine readable storage medium.

Figure 2:
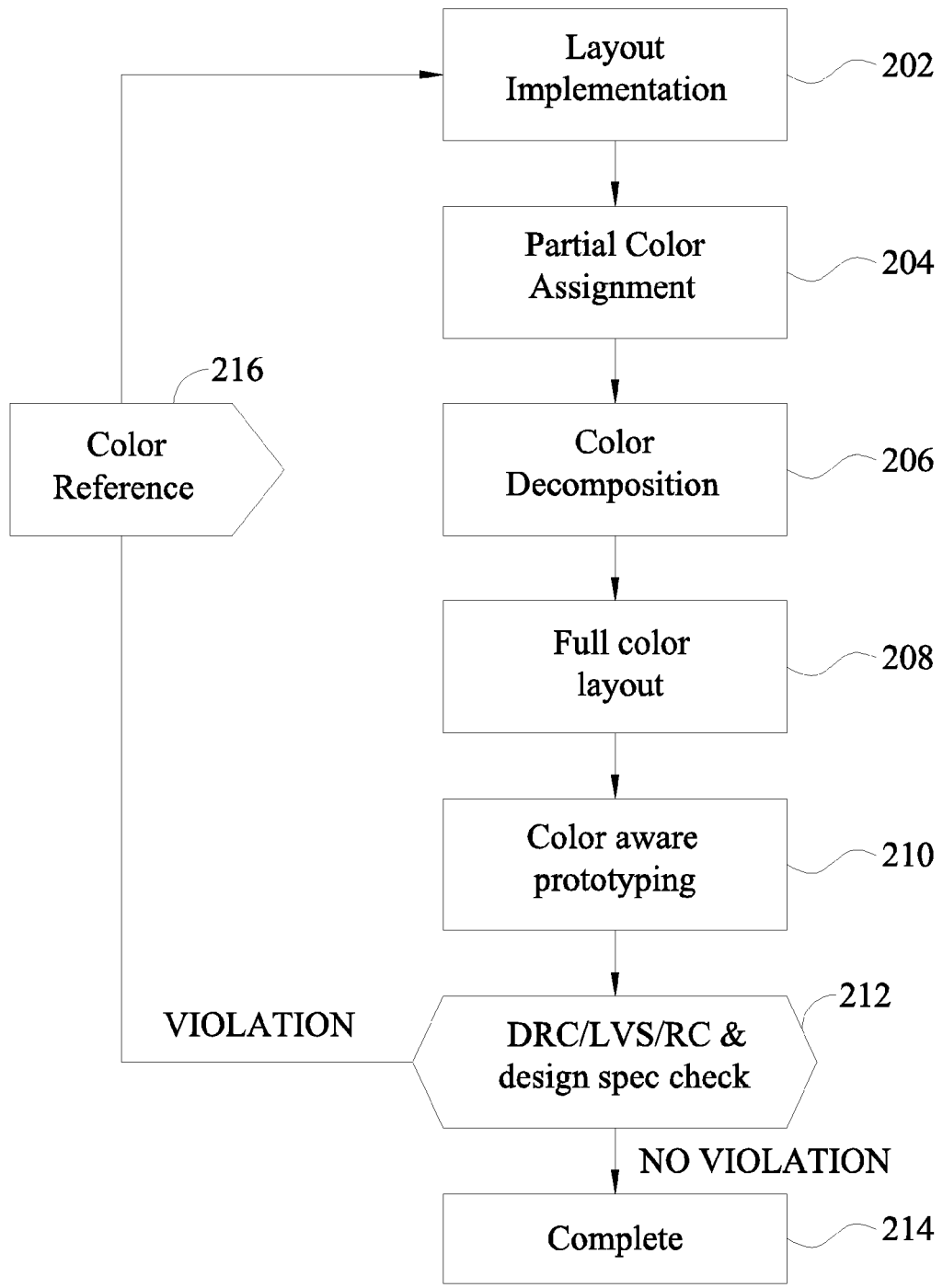
FIG. 2 is a flow chart of a method, in accordance with some embodiments.

FIG. 2 is a flow chart of a full coloring method according to some embodiments. In a full coloring method, the designer performs full coloring of the circuit patterns, using computer implemented electronic design automation (EDA) tools.

At step 202, the place and route engine of the EDA tool outputs a preliminary layout, without mask assignments (coloring information). This step generates mask assignment information for forming the plurality of patterns on a layer of an integrated circuit (IC) by multipatterning. The mask assignment information includes, for each of the plurality of patterns, a mask assignment identifying which of a plurality of masks is to be used to form that pattern, and a mask assignment lock state for that pattern. At this stage, the lock state for all of the patterns is "unlocked."

At step 204, the user (e.g., a designer) inputs partial coloring information into the computer implemented tool. For example, in some embodiments, the designer groups one or more networks of timing critical patterns together, to be formed in the same mask. In some embodiments, the designer tags (anchors) all of the patterns to be grouped into a single grouping. In other embodiments, the designer tags a first group of patterns to be formed together on the same mask as each other, and tags a second group of patterns to be formed together on the same mask as each other. The EDA tool can assign the first group and the second group to the same mask as each other or to different masks, so long as the patterns within each individual group are assigned together with each other. The user can lock the mask assignment lock state of any of the patterns.

At step 206, after the designer performs partial coloring, the designer runs the color decomposition engine to provide a full color layout, for each individual intellectual property block (IP) of the application specific integrated circuit (ASIC). An IP block contains one or more functions. Non limiting examples of IP blocks can include a communications interface, an application programming interface (API), a game, an audio-visual media player, or a radio or television tuner. This step generates a new mask assignment for each of the plurality of patterns having an "unlocked" mask assignment lock state.

At step 208, the EDA tool generates a fully colored layout, in which each pattern is assigned to one of the available masks, and the patterns within each individual group are assigned to the same mask. The designer can make changes to the individual IPs as desired, until the layout of each IP is "clean," without any design rule violations within the individual IPs.

At step 210, the designer executes color aware placement prototyping. This process considers the location, shape and color assignment of each individual pattern along the entire perimeter of each IP block. Wherever two IPs are adjacent to each other, the process determines whether the abutting patterns along the perimeter of two adjacent IP blocks violate the MPT design rules. For example, MPT design rules specify a minimum spacing between adjacent patterns to be formed by the same mask (regardless of whether the patterns are part of the same IP block or are part of two adjacent IP blocks). Different IP block placement options are evaluated, without changing the design or color decomposition within the individual patterns inside each IP. These placement options can vary spacing between two adjacent IP blocks, or change the arrangement of the IP blocks. An example of an arrangement change includes changing from a first placement with IP block 1 (IP1) on the left and IP block 2 (IP2) on the right to a second placement with IP2 on the left and IP1 on the right.

The color aware prototyping can apply full color design rules that affect placement. For example, if patterns on the perimeters of two adjacent IP blocks are assigned to the same mask, and are separated from each other by a distance smaller than the minimum spacing design rule, the color aware prototyping can increase the spacing between those two IP blocks. The color aware prototyping step can correct a number of MPT violations that relate to spacing between patterns in two different "MPT compliant" IP blocks. Such violations can be created during the placement process, even for DRC clean IP blocks.

At step 212, following the color aware prototyping, the DRC and LVS checks are performed on the fully colored layout, and RCX is performed. If no violations are found, step 214 is performed. If any violations are found, then step 216 is performed.

At step 214, the full coloring design flow is complete

At step 216, mask assignment (color) reference information is stored in a non-transitory medium, and the layout information is returned to step 202 for revision. The mask assignment reference information allows re-use of the coloring information that is not affected by the found violations, to reduce the time of any coloring reiteration. In some embodiments, when DRC/LVS/RCX violations are found, the patterns causing the violations and their coloring (mask assignment) information are preserved in the layout mapping file to assist the designer and revising the layout.

Figure 3:
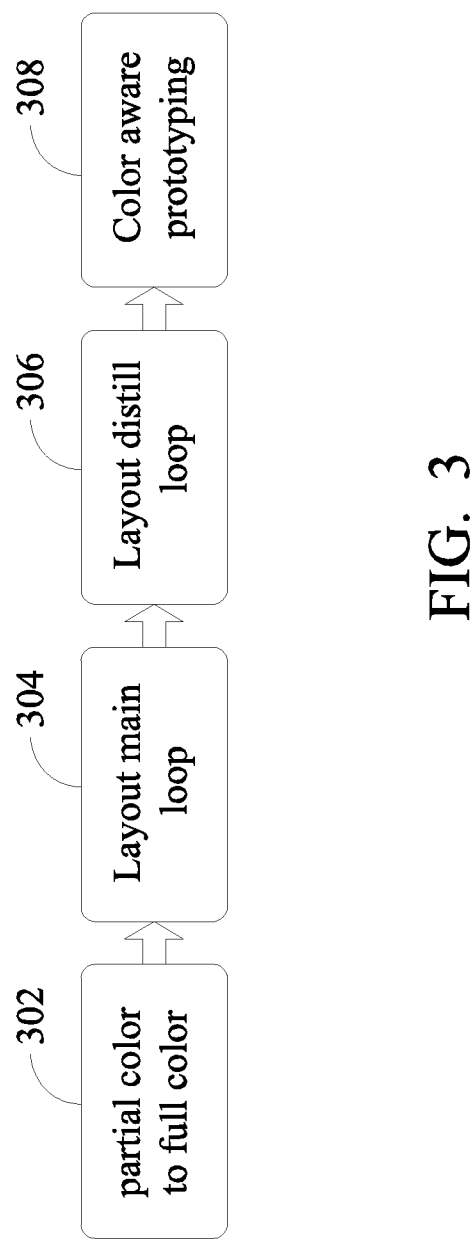
FIG. 3 is a flow chart of a method, in accordance with some embodiments.

FIG. 3 is a flow chart of a method according to some embodiments.

At step 302, every polygon/shape of the uncolored layout is assigned to a respective mask (color) before performing DRC/LVS/RCX. In some embodiments, a preliminary set of mask assignments (suggestions) is generated by the EDA tool, and displayed for the user to modify or approve.

At step 304, the main full color mask assignment loop described above with reference to FIG. 2 is performed during layout creation. In some embodiments, the users (e.g., designers) can use the displayed color attributes to assist the user in assigning masks (colors). For example in some embodiments using DPT, five color attributes are available: unassigned, mask A unlocked, mask B unlocked, mask A locked, and mask B locked. In some embodiments, the patterns are displayed with the attribute of each pattern identified by its respective hue, fill pattern, outline, or tone, or any combination thereof. The user can view the color attribute of each pattern according to the preliminary assignments generated in step 302, and modify attribute of any of the patterns. In some embodiments, the lock attribute is indicated by displaying the pattern with an outline to show the locked state, and without outline to show the unlocked state.

At step 306, a "distill loop" can provide easier design flow for engineering change order (ECO) purposes. An ECO is typically performed to modify a design after tapeout. The distill loop is used to minimize mask changes due to an ECO. Step 306 is not performed for new layouts. The distill loop of step 306 is described below, with reference to FIG. 11. The distill loop is not performed when a new design is first given mask assignments.

At step 308, a color aware prototyping process is performed, to identify placement induced violations due to proximal patterns at the peripheries of adjacent IP blocks assigned to the same mask. The color aware prototyping process is described below, with reference to FIGS. 9(*a*) to 9(*e*).

Figure 4A:
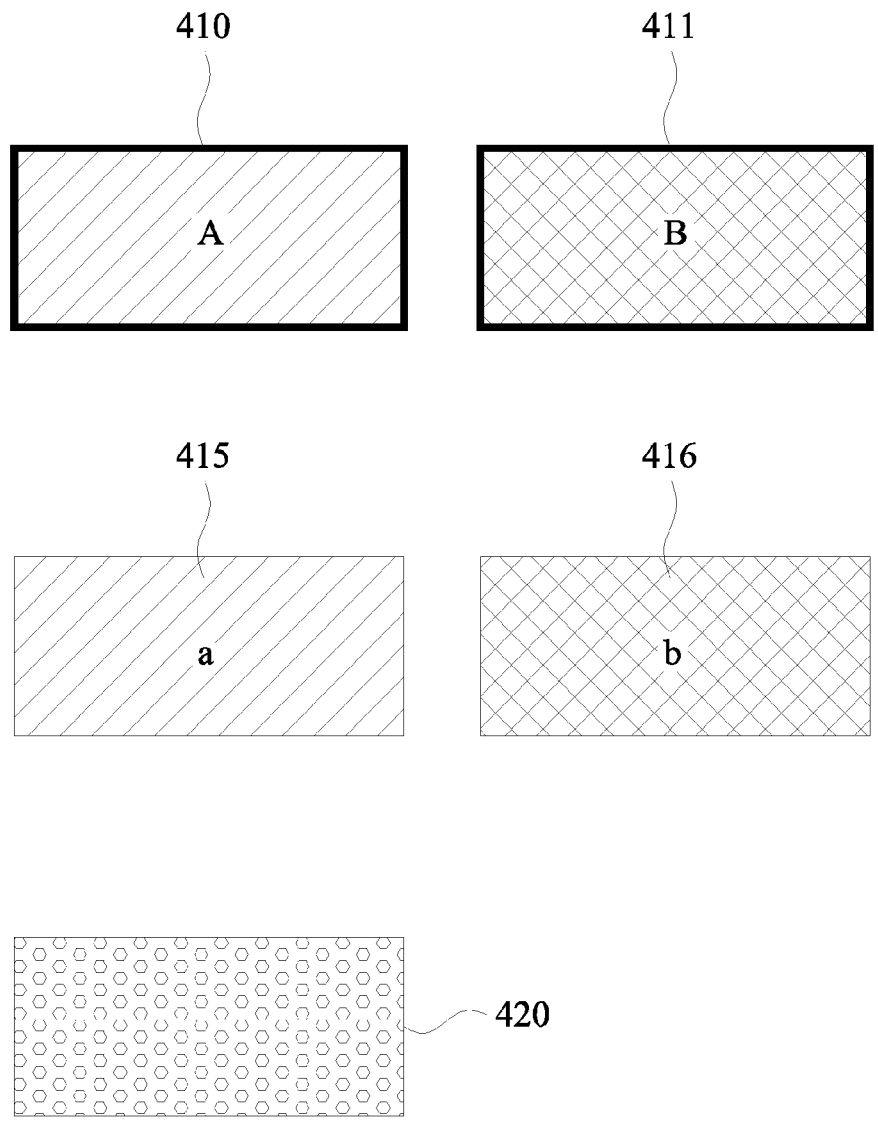
FIG. 4(a) is a legend showing a plurality of symbols displayed to indicate mask assignment and mask assignment lock state of a pattern, in accordance with some embodiments.

FIG. 4A shows an example of a legend comprising a set of symbols used for displaying the mask assignment attribute and lock state during the full coloring method, according to some embodiments. Pattern 410 indicates a user pre-colored (or locked) assignment to mask A. Pattern 411 indicates a user pre-colored (or locked) assignment to mask B. Both outlined patterns 410, 411 indicate the locked state. Pattern 415 indicates an unlocked assignment to mask A, automatically generated by the color decomposition engine of the EDA tool (or unlocked by the user, from a locked state). Pattern 416 indicates an unlocked assignment to mask B, automatically generated by the color decomposition engine of the EDA tool (or unlocked by the user, from a locked state). Pattern 420 indicates a pattern which has not yet been assigned by the user or the EDA tool to either mask. The convention of using fill pattern (to denote mask A or B) and outline (to denote locked patterns) is used throughout the remainder of this description. This is just one example, and other embodiments use other combinations of hue, saturation, fill pattern, outline, tone, upper versus lower case, or alphabetic versus numeric labels to graphically display the mask assignment attribute and/or the mask assignment lock state on a display device. Although FIG. 4(*a*) uses fill pattern, in other embodiments, the mask assignment is indicated by hue on a color display.

In FIG. 4(a), "A" 410 and "B" 411 refer to user pre-colored patterns, which are locked and not changed by the color decomposition engine. The lower case identifiers, "a" 415 and "b" 416 represent mask assignment that are not locked, and which the EDA tool can change to resolve a multipatterning conflict, or to optimize a layout. The color decomposition engine provides the unlocked mask assignments as suggested mask assignments, which the user can optionally modify and/or lock. If the user does not lock the assignments of the "a" and "b" pattern mask assignments, the color decomposition engine can change these assignments during subsequent iteration(s).

The un-colored patterns 420 do not have suggested assignments. The patterns have the un-colored attribute 420 immediately after the initial layout is generated at step 202, before the partial coloring step 204.

Figure 4B:
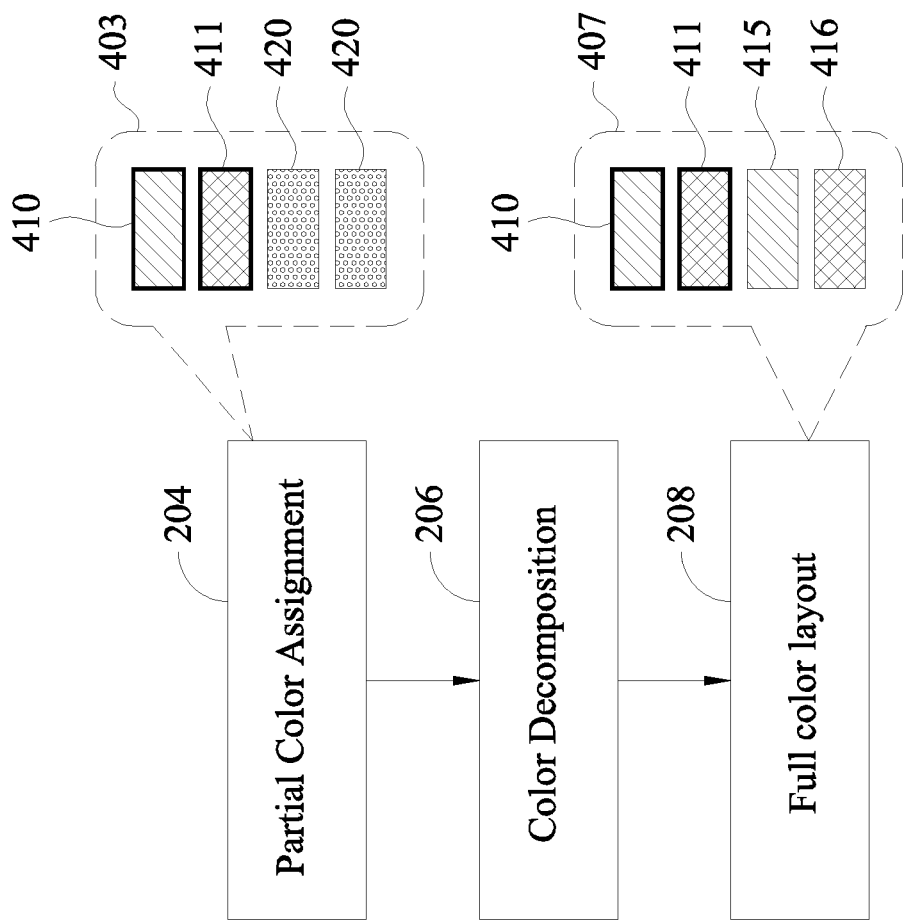
FIG. 4(b) is a flow chart showing mask assignments and lock states at different steps of the method, in accordance with some embodiments.

FIG. 4(b) shows schematically how the coloring state 403, 407 of the patterns can change during execution of the full coloring process flow, according to some embodiments. Steps 204, 206 and 208 of FIG. 2 are shown next to a set of likely coloring states. Prior to step 204, all of the patterns have the unassigned state, indicated by fill pattern 420. During the partial coloring step 204, the user assigns selected patterns to mask A (designated by fill pattern 410) or mask B designated by fill pattern 411). The mask assignments selected by the user are locked. The patterns which are not selected by the user retain the unassigned state 420. The combination of patterns at the end of step 204 is designated by state 403.

During the full coloring step 206 in FIG. 4(b), the color decomposition engine of the EDA tool assigns all of the previously unassigned patterns (having the unassigned attribute 420) to mask A (designated by fill pattern 415) or mask B (designated by fill pattern 416). The mask assignments which are generated by the color decomposition engine are not locked. The combination of patterns at the end of step 208 is designated by state 407.

The color decomposition engine takes into account the nature of the mask A process and mask B process. This includes whether successful patterning of the B patterns is independent of the A patterns. This engine takes into account the use of "variation friendly" patterns (and those which are not variation friendly), and the use of "performance friendly patterns" (and those which are not performance friendly (as explained below in the discussion of FIGS. 12(a) to 12(e). When the user has completed all mask assignment changes and mask assignment lock state changes, the color decomposition engine again automatically generates a new or revised set of unlocked mask assignments for all unlocked patterns.

At the completion of the color decomposition step 206, a full color layout is provided. The full color layout has no unassigned patterns 420.

On the next page, FIG. 5(a) shows an A pattern 502 and an adjacent B pattern 504 according to some embodiments. This example is formed by an SADP process. The area surrounding the A pattern 502 is a spacer 503 which is used as the hard mask to form the B pattern 504. The dashed line 505 shows the desired B pattern according to the design. If the desired B pattern 505 is too close to the A pattern 502, process variations can cause the spacer 503 to encroach on the B pattern region 505, so that the line width of the as-formed B pattern 504 is thinner than the desired B pattern 505, and the distance from the A pattern 502 to the as-formed B pattern 504 is greater than the distance according to the design.

The examples of FIGS. 5(b) to 5(d) also show patterns formed by an SADP process in accordance with some embodiments, but for ease of viewing, the spacers 503 are omitted from FIGS. 5(b) to 5(d).

FIG. 5(b) shows three adjacent patterns 510-512 in another example according to some embodiments using an SADP process. If the two outer patterns 510, 512 are formed by mask A and the center pattern 511 is formed by mask B, the line width of B pattern 511 is reduced in the section between the two A patterns 510, 512 (i.e., the portion of the B pattern 511 corresponding to the projection of the A patterns 510, 512 on the B pattern 511). This is a result of encroachment by the spacers (not shown) surrounding A patterns 510, 512 into the desired B pattern region. This causes increased resistance in the B pattern 511, and an increase in the distance between patterns 510 and 511, and the distance between patterns 511 and 512.

On the other hand, if the two outer patterns 510, 512 are formed by mask B and the center pattern 511 is formed by mask A, the correct dimensions of the center pattern 511 are ensured, even if there are process variations. Thus, assignment of the center pattern 511 to the A mask creates what is referred to herein as a "variation friendly pattern." A variation friendly pattern is a pattern assigned to a first mask, which is not affected by a variation in the process performed using a second mask. In some embodiments, the color decomposition engine is programmed to recognize a set of patterns as shown in FIG. 5(b), and automatically suggest assignment of the center pattern to mask A to form a variation friendly pattern.

FIG. 5(c) shows another example according to some embodiments, in which assignment of the rectangle 522 to the A mask and the "L" shape 521 to the B mask can cause encroachment of the spacer (not shown) surrounding the rectangle 522 into adjacent portions of the "L" shaped pattern 521. This encroachment can cause line width and resistance variations in the "L" pattern 521, impacting performance. If the "L" shaped pattern 521 is assigned to the A mask, and the rectangle 522 is assigned to the B mask, this problem is avoided. Thus, assigning the "L" shaped pattern 521 to the A mask provides a performance friendly pattern. A performance friendly pattern is a pattern assigned to a first mask, performance of which is not affected by a variation in the process performed using a second mask, but for which performance could be affected if the pattern is assigned to the second mask. Conversely, assigning the "L" shaped pattern 521 to the "B" mask does not create a performance friendly pattern). In some embodiments, the color decomposition engine is programmed to recognize a set of patterns as shown in FIG. 5(c), and automatically suggest assignment of the "L"-shaped pattern to mask A to form a performance friendly pattern.

FIG. 5(d) shows another example of two patterns 531, 532 in a run-end configuration in accordance with some embodiments. If the vertical pattern 532 is assigned to mask A and the horizontal pattern 531 to mask B, the spacer (not shown) around the vertical pattern 532 can encroach on the horizontal pattern 531, causing necking and increased resistance. On the other hand, if the vertical pattern 532 is assigned to mask B and the horizontal pattern 531 to mask A, this problem is avoided, and a performance friendly pattern is created. In some embodiments, the color decomposition engine is programmed to recognize a set of patterns as shown in FIG. 5(d), and automatically suggest assignment of the horizontal pattern to mask A to form a performance friendly pattern.

For yield-friendly results, best results are achieved if the total pattern area on a given layer assigned to the A mask and the total pattern area on the given layer assigned to the B mask are equal or approximately equal. To achieve this target, the color decomposition engine can add dummy patterns assigned to the mask having smaller total pattern area, to bring the A patterns and B patterns into balance.

Given a preliminary (uncolored) layout, the system can automatically decompose a shape into two groups by referencing a database stored in a non-transitory computer readable storage medium. Within the database, each record stores a template or configuration of patterns (e.g., 2 parallel lines as shown in FIG. 5(a), three parallel lines, as shown in FIG. 5(b), an "L" shape with an adjacent pattern as shown in FIG. 5(c), or a run-end configuration, as shown in FIG. 5(d)). Each record also includes a set of mask assignments for improving tolerance of variation, improving performance, or improving yield, as described above. Given an uncolored preliminary layout, the system compares the patterns within a given region to the combinations of patterns in the database. When a match is found, the patterns in the layout are automatically assigned to the masks indicated by the record in the database for the matching configuration of patterns.

Figure 6A:
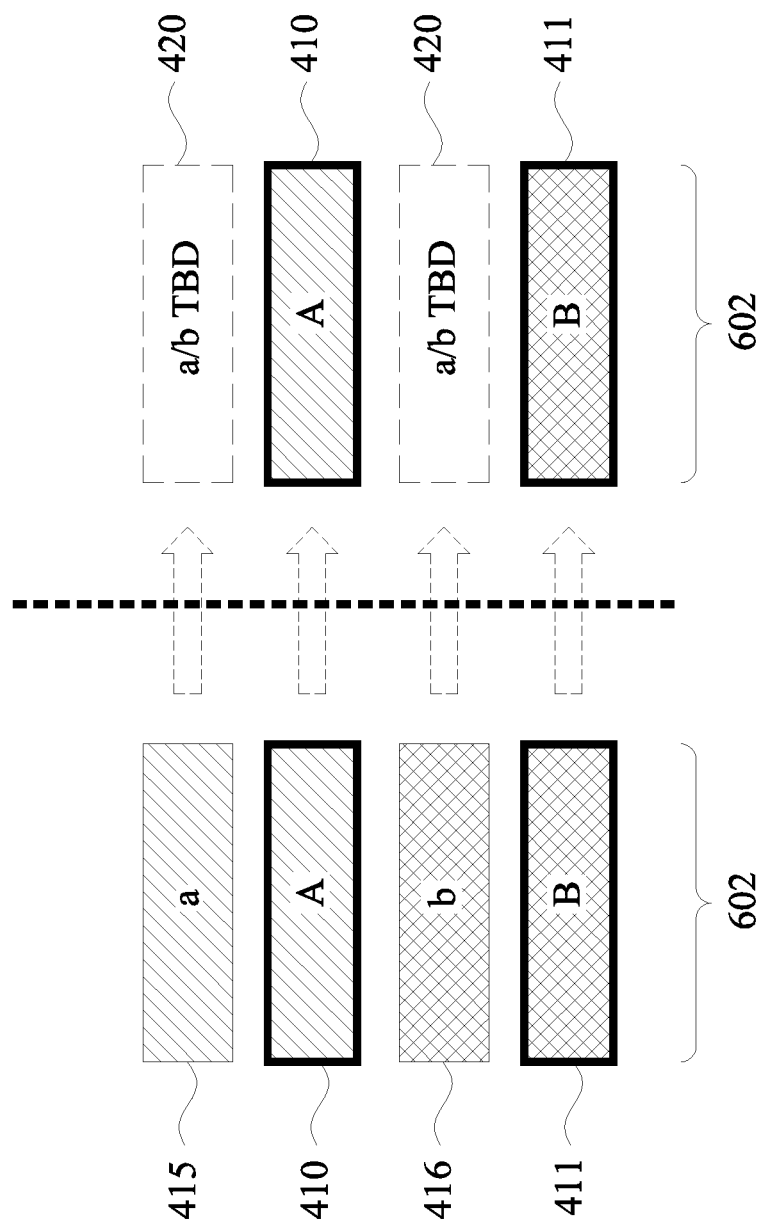
FIG. 6(a) shows how mask assignment information is retained in a partial coloring paradigm, in accordance with some embodiments.
Figure 6B:
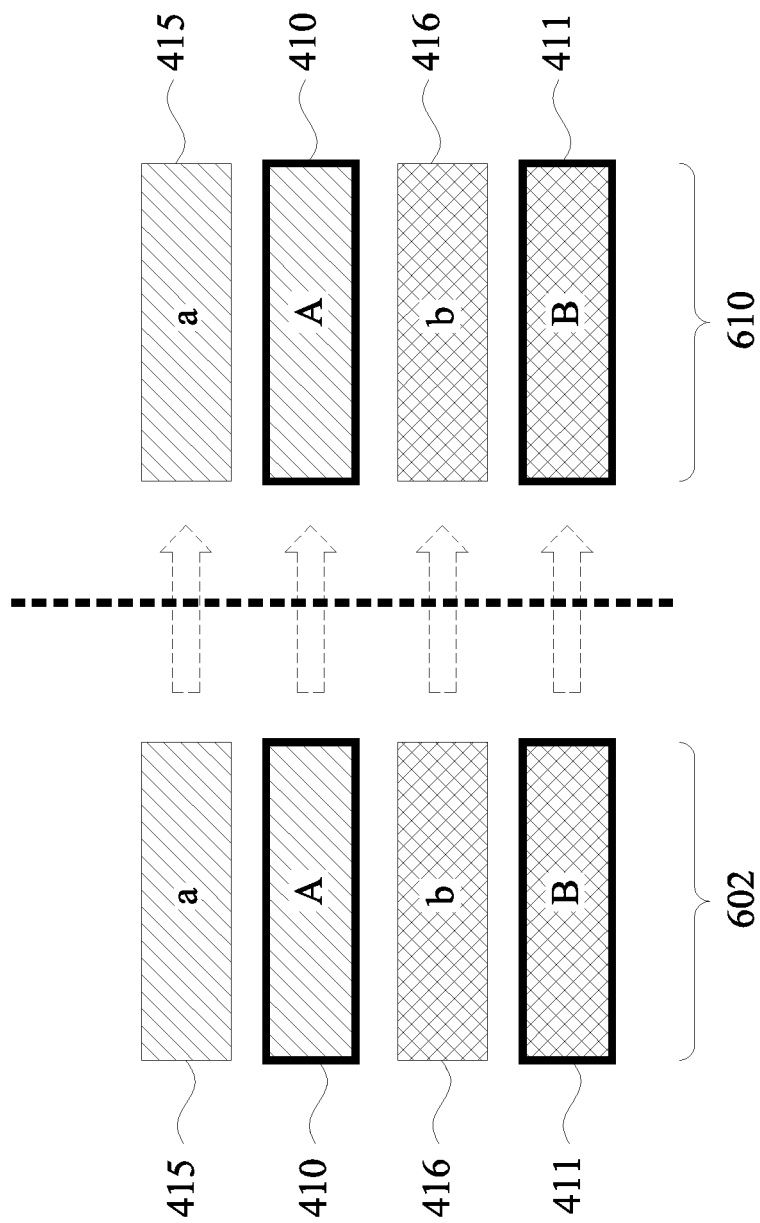
FIG. 6(b) shows how mask assignment information is retained in a full coloring method, in accordance with some embodiments.

FIGS. 6(a) and 6(b) schematically show examples of two different embodiments of methods for storing and accessing mask assignment information in the layout mapping file.

In partial coloring methods (e.g., FIG. 1), coloring information is only retained in the layout mapping file for the locked patterns. The coloring information for patterns that are not pre-assigned by the designer is not stored in the layout mapping file. FIG. 6(a) schematically shows the state 602 of the mask assignments at the completion of mask decomposition in accordance with some embodiments. The layout has locked patterns 410 and 411 assigned by the user and unlocked patterns 415, 416 automatically assigned by the EDA tool. As shown in FIG. 6(a), if the designer wants to revise the layout after color decomposition, when the designer loads the colored layout into the layout editor of the computer implemented EDA tool, the state 604 is displayed. The locked (pre-colored) patterns 410, 411 appear with their colors indicated, but the unlocked patterns 420 do not display any coloring information due to the unlocked property. They appear as unassigned patterns 420. Thus, for implementing a design change (e.g., an ECO), the designer and/or system repeats the time and effort for generating mask assignments for the unlocked patterns 420.

In some full coloring embodiments, as shown in FIG. 6(b), the layout editor will display coloring hints (indicated by a 415 and b 416) for the designer. That is, the mask assignments 415, 416 automatically generated by the color decomposition engine of the EDA tool are saved in a non-transitory computer readable storage medium. These automatically generated mask assignments are referred to herein as "hints" or "suggestions," because the user can choose whether to lock them and/or whether to modify them. The user can retrieve this mask assignments when revising the design. To allow this capability, the color decomposition engine stores (e.g., in the layout mapping file) the color assignments of all unlocked a and b patterns 415, 416 assigned to masks by the color decomposition engine. The data can be included in two color attributes. For example, one field of the mapping file can include locked/unlocked data, and the other field can include mask a/mask b.

After color decomposition, when the designer opens the layout data in the layout editor, the coloring hints 415, 416 will reference the output of the color decomposition, including the color attributes. The layout editor will display the colors 410, 411 of locked patterns, and also the unlocked a and b pattern colors 415, 416. The layout editor is thus configured to read the two color attribute fields and display all patterns with the color and locked status. Because these data are all stored in the layout mapping file, they are available for subsequent access, including but not limited to access after tapeout, to implement design changes with reduced time and effort.

Figure 7A:
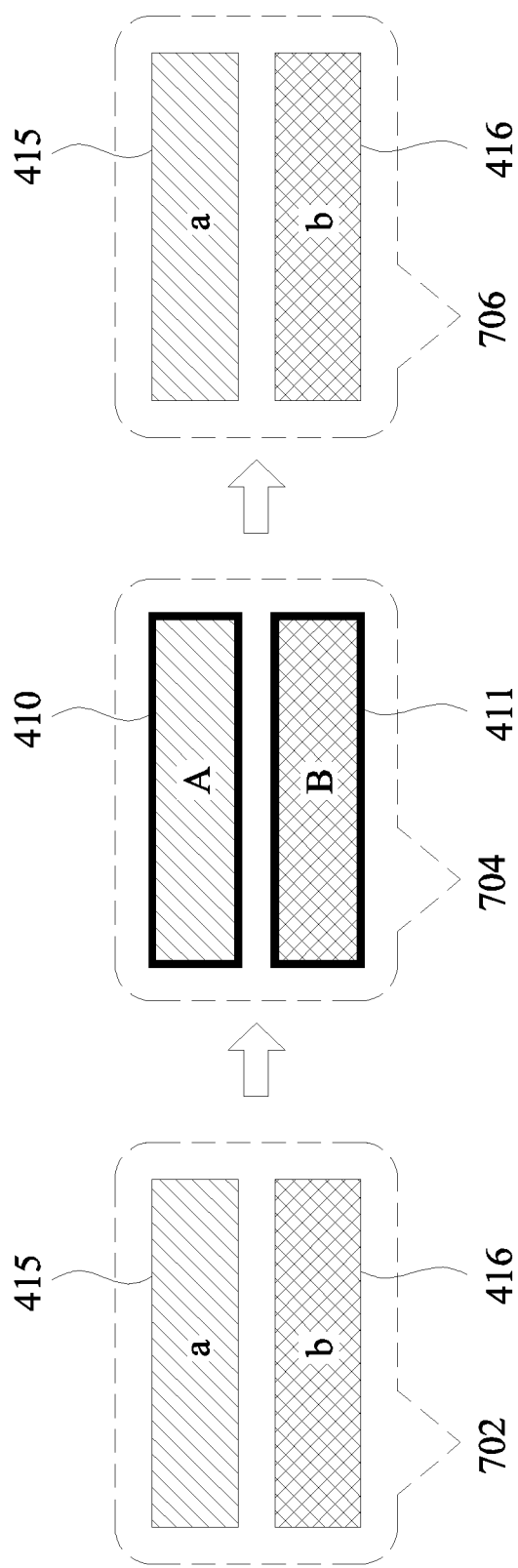
FIG. 7(a) shows how mask assignments are automatically generated, locked, and unlocked, in accordance with some embodiments.

FIG. 7(a) shows the lock and unlock flow in accordance with some embodiments. In step 702, the layout editor provides coloring hints for mask a 415 and mask b 416 based on the output of the color decomposition engine. In step 704, the user locks the mask assignments, so the patterns are designated mask A locked 410 or mask B locked 411. In step 706, the user unlocks the locked patterns 410, 411. The patterns are again labeled mask a unlocked 415 and mask b unlocked 416. The unlocked patterns are displayed with the coloring hints.

Figure 7B:
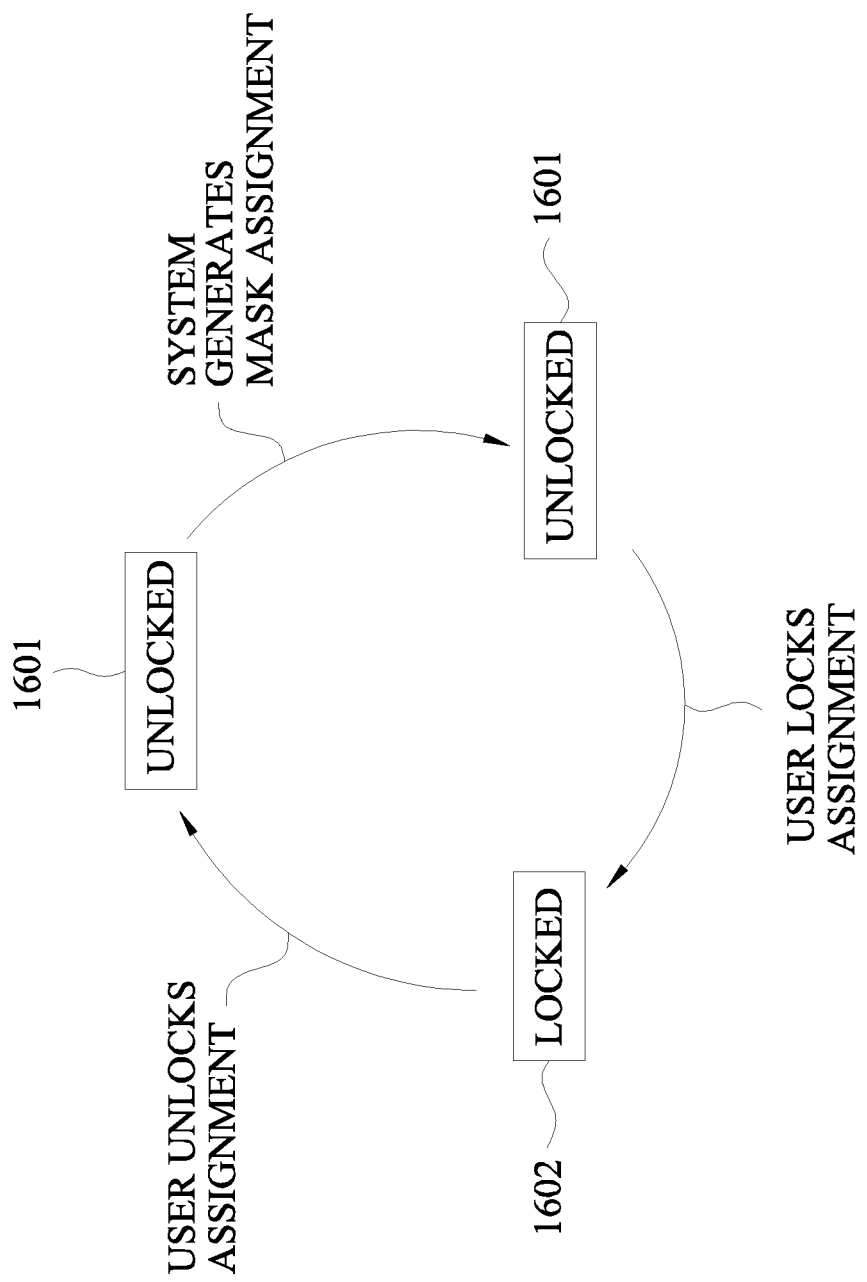
FIG. 7(b) is a state diagram showing the lock states of a mask assignment, in accordance with some embodiments.

FIG. 7(b) is a state diagram of the mask assignment lock state of the mask assignment information for a pattern. When a pattern is initially laid out, the system generates a suggested mask assignment, and the mask assignment lock state is set to "unlocked." The user can change the mask assignment lock state is to "locked," to accept the automatically generated assignment suggestion, or change the mask assignment and then change the mask assignment lock state is to "locked." In either case, the state becomes, "locked," 1602 and remains in that state until the user unlocks the state. If the user unlocks the state, the state is returned to "unlocked," 1601, and the system will generate a new suggested mask assignment during the next execution of the full coloring layout step 206 (FIG. 2).

FIGS. 8(a) to 8(i) show the layout displayed at various steps of the coloring process in accordance with some embodiments. For ease of understanding, in FIGS. 8(b) to 8(i), only the patterns whose mask assignment state is changed are labeled with reference numerals. The patterns which are not labeled in FIGS. 8(b) to 8(i) retain the same state as in the adjacent previous figure. The dashed line around FIGS. 8(c) and 8(f) indicate that the contents of these two figures are displayed on a display 1522 (shown in FIG. 15).

Figure 8A:
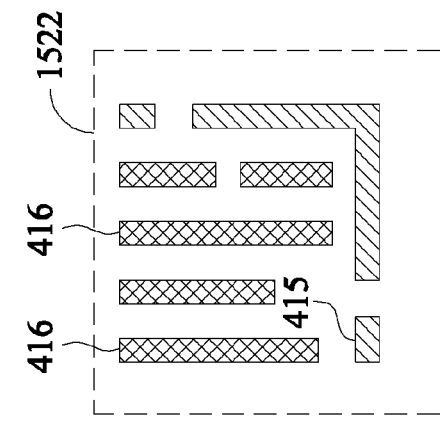
FIGS. 8(a) to 8(i) are diagrams showing the mask assignments and mask assignment lock states of a plurality of patterns during a full coloring process, in accordance with some embodiments.
Figure 8B:
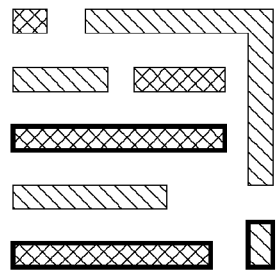

FIG. 8(a) is an example of an uncolored layout in accordance with some embodiments, with all patterns showing the unassigned state 420.

In FIG. (b), during initial color decomposition, the patterns are automatically assigned to colors a 415 and b 416. All patterns are shown in the unlocked state. The displayed mask assignments are suggestions to the designer.

Figure 8C:
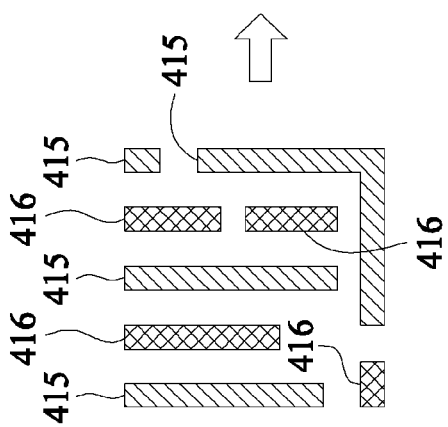

In FIG. 8(c), when the user opens the layout in the layout editor, all the suggested colors are displayed for the (unlocked) a 415 and b 416 patterns. The user has modified two of the suggested mask assignments from a 415 to b 416, and has changed another of the suggested mask assignments from a 416 to b 415.

Figure 8D:
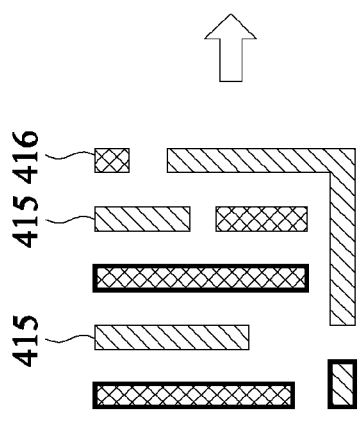

FIG. 8(d) shows the result of the user locking the assignments of one of the A pattern 410 and two of the B patterns 411.

Figure 8E:

FIG. 8(e) shows the results of subsequent color decomposition. The results from the color decomposition engine change the mask assignments of the unlocked patterns from the initial color decomposition results shown in FIG. 8(b), because of the user's changes. The decomposition tool changes the suggested mask assignments of two of the patterns from b 416 to a 415, and changes the assignment of one of the patterns from a 415 to b 416.

Figure 8F:
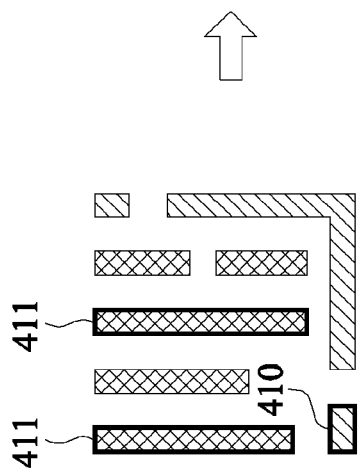

FIG. 8(f) shows the result displayed when the designer again opens the layout mapping file in the layout editor. The a 415 and b 416 suggested mask assignments, as changed by the decomposition tool, have been preserved and are displayed. The locked patterns 410 and 411 are also preserved and displayed.

Figures 8G, 8H, 8I:
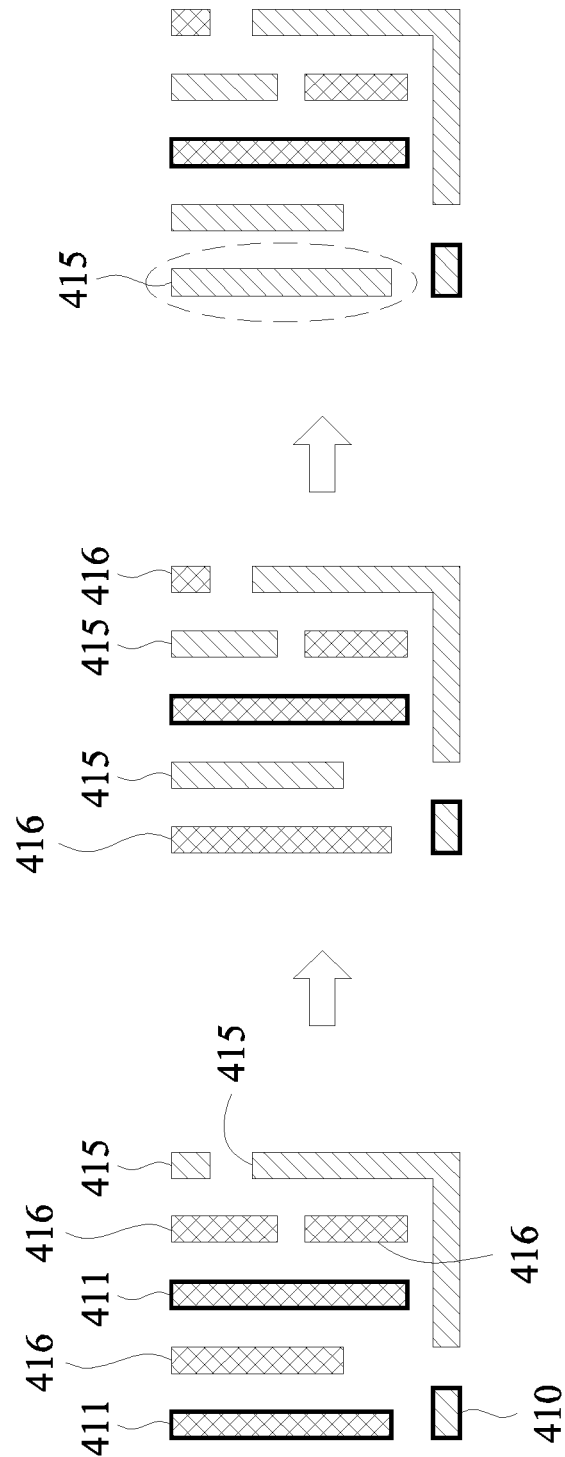

FIG. 8(g) shows another example, in which the user has locked the assignment of two patterns as "B" patterns 411 (corresponding to the state shown in FIG. 8(d) described above. The color decomposition engine is then run, and changes three of the color assignments of unlocked patterns, so the state is the same as described above with reference to FIG. 8(e). The user has the ability to release one of the locks.

FIG. 8(h) shows the result after the user releases the lock on one pattern, which changes from the locked state 411 to the unlocked state 416. The user also changes the mask assignments of other unlocked patterns 415 and 416 without locking them.

FIG. 8(i) shows the result of subsequent execution of the color decomposition engine, after unlocking the pattern in FIG. 8(h). The color decomposition engine changes the mask assignment of the pattern that was unlocked.

FIGS. 9(a) to 9(e) show examples of the color prototyping method, in accordance with some embodiments. As noted above, the designer provides one or more "DRC clean" IP blocks, such that there are no internal MPT violations within any of the IP blocks. During placement by the EDA place and route tool, patterns at the peripheries of two adjacent IP blocks assigned to the same mask as each other can create a new MPT violation. Color aware prototyping examines the relationships between adjacent patterns on the peripheries of adjacent IP blocks. Color aware prototyping identifies and corrects these placement induced violations by modifying placement, without changing the internal design of the individual IP blocks 902, 904.

FIG. 9(a) shows two IP blocks 902 and 904, designated IP1 and IP2. Each IP block 902, 904 has passed internal DRC and LVS checks.

FIG. 9(b) shows an initial candidate placement floorplan 950 for the IP blocks 902, 904. The pattern 910 of IP1 902 and pattern 912 of IP2 904 have the same mask assignment (mask B 411), and are separated from each other by a distance D0 smaller than the minimum spacing design rule (referred to herein as G0) for clear patterning on the same mask. The color aware prototyping facility of the EDA placement tool attempts alternative placements to resolve the MPT conflict between the patterns 910, 912, as shown in FIGS. 9(c) and 9(d).

In FIG. 9(c) in an alternative floorplan 954, when placing two full colored IP blocks 902, 904, the tool is aware of a "keep out space". The keep-out space is a color aware minimum spacing between adjacent patterns in adjacent IP blocks. In order to avoid DRC violations with same or different color. In some embodiments, a first keep out space D3 is used for patterns of the same color (i.e., assigned to the same mask). A smaller minimum distance applies for patterns that are assigned to different masks from each other. Thus, one option for the placement tool is to increase the spacing between IP blocks 902 and 904 until the spacing between the patterns 910 and 912 is at least D3.

FIG. 9(d) shows another candidate placement floorplan 952, in which IP1 902 is moved to the right of IP2 904 (and IP2 904 is moved to the left of IP1 902). In some embodiments, the computer is configured to modify the placement of the IP blocks 902, 904 by moving the second circuit block 904 from a first side (e.g., right) of the first circuit block 902 to a second side (e.g., left) of the first circuit block 902, so that a separation between the a third pattern 928 in the first circuit block 902, nearest to the second circuit block 904, and a fourth pattern 928 in the second circuit block 904, nearest the first circuit block 902, satisfies the minimum spacing design rule.

FIG. 9(d) also shows that the color aware prototyping can use two different minimum spacing rules between peripheral patterns in adjacent IP blocks: one minimum spacing for patterns assigned to the same mask, and another minimum spacing for patterns assigned to different masks. For example, patterns 922 is assigned to mask B and pattern 924 is assigned to mask A. These patterns 922, 924 have different mask assignments, and can use a smaller minimum spacing D1. On the other hand, patterns 926 and 928 are both assigned to mask A, and use a larger minimum spacing D2. The place and route tool can adjust the spacing between IP1 902 and IP2 904 during color aware prototyping to ensure that both the minimum spacings D1 and D2 are met for respective pattern pairs 922, 924 and 926, 928.

FIG. 9(e) shows dummy insertion during color aware prototyping. During color aware prototyping, the placement of one or more IP blocks can change. In some embodiments, color aware prototyping also takes into account target and actual pattern density (the ratio of pattern area to total IC area). In some embodiments, the color aware prototyping module inserts dummy patterns to keep the minimum design rule distances for full colored IP without any DRC violations, so that a ratio of total patterned area to total IC area in the layer is at least a predetermined value, and at the same time balancing A/B patterns. In some embodiments, the color aware prototyping engine determines a first total area of patterns assigned to a first mask A of the at least two masks and a second total area of patterns assigned to a second mask B of the at least two masks, and assigns the dummy patterns to at least one of the first or second mask so as to maintain a percentage difference between the first and second total areas below a predetermined threshold value. For example, the dummy patterns can be assigned to either or both of the masks A and B, to maintain the difference between the pattern density of mask A and the pattern density of mask B within a predetermined value (e.g., 5%) of each other. The dummy patterns are not connected to any of the active devices. In some embodiments, the dummy patterns are not connected to any other patterns.

FIGS. 10(a) and 10(b) show a method of handling DRC violations within an IP block, if detected during color aware prototyping. As explained above, color aware prototyping does not change the patterns within the individual IP blocks, but addresses placement issues between previously colored patterns on the peripheries of adjacent IP blocks. If a DRC violation is found within an IP block during color aware prototyping, the IP block is returned to the designer for resolution of the internal problems.

In FIG. 10(a), MPT DRC violations are found, related to the three patterns 1002. In some embodiments, the patterns involved in the violations are flagged with an indicator 1002. When a full colored layout internal to an IP block violates a DRC rule (regardless of placement of that IP block), the mask assignment reference step disables (invalidates) the color data on the patterns having the indicator 1002 (the patterns which caused the DRC violations), and return them to uncolored status 420. Also, the mask assignment (color attributes) of all the remaining colored patterns without DRC violations are kept. For those patterns (having the indicator 1002), whose color data is disabled, the designer can manually reassign them. FIG. 10(b) shows the color state of the layout after invalidating the mask assignments of the patterns having the indicator 1002; they are all returned to the unassigned state 420.

This process does not impact other DRC-clean patterns. Note that these problems in DRC can be due to a variety of conditions within the IP block. These problems are not addressed during color aware prototyping (which is performed at the IP level). In the example shown, since these three shapes have conflicts inside the IP, in some embodiments, the designer will fix them before again executing color aware prototyping. When the designer has corrected the internal DRC violations, the designer can lock all the mask assignments again. Then color aware prototyping is performed again to place the IP blocks without changing color assignments inside the IP blocks.

Figure 11:
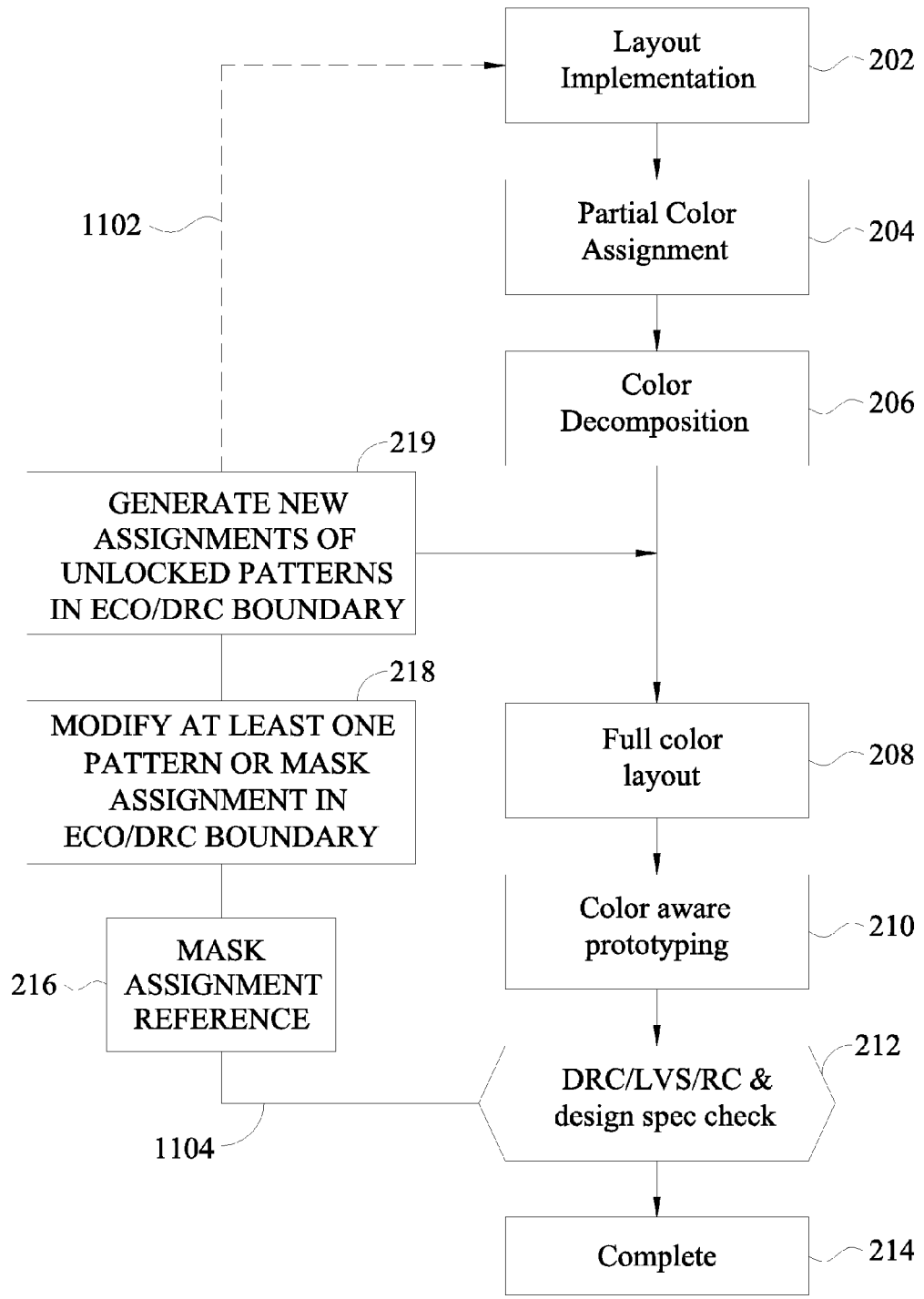
FIG. 11 is a flow chart of a fast "distill loop" for re-using previously stored full-coloring mask assignment information when implementing a design change, in accordance with some embodiments.

FIG. 11 shows the flow chart of FIG. 2, with a process flow shortcut for accommodating ECOs, referred to above as the "distill loop." The steps 202, 204, 206, 208, 210, 212 and 214 in FIG. 11 are the same as described above with reference to FIG. 2, and their descriptions are not repeated, for brevity. These steps have been performed during the initial IC design, prior to tapeout.

However, the jump 1102 is replaced by the jump 1104 when handling an ECO (or other revision to a previously fully colored layout). In some embodiments, for the 10 nm technology node and smaller geometries, a full colored layout has been created for physical verification within the custom design flow. (e.g., DRC/LVS/RC and post-simulation). As discussed above, after the initial design is complete (e.g., for an ECO performed after tapeout or to implement a local modification) there is no need to go repeat the complete color decomposition of steps 204 and 206. The steps of layout implementation 202, partial color assignment 204 and color decomposition 206 are skipped.

The designer opens the layout in the layout editor. All previously input and previously generated coloring information (mask assignment and lock state information) is displayed.

In some embodiments, as described in FIG. 11, a short loop is provided for ECO implementation to reduce the turn-around time of iteration. When processing an ECO, the user can reserve previously generated color (mask assignment) information without modification.

The designer's input is a partially colored layout with some patterns pre-assigned to mask A or B to avoid color related DRC violations. This method de-couples violations without mixing sub-minimum spacing-loop, risk patterns and physical layout geometry in the design rules. The system receives additional user inputs modifying at least one of the plurality of patterns in the DRC/ECO region, and setting a mask assignment thereof. The system combines the mask assignment of the modified pattern with a subset of the previously stored user inputs and a subset of the previously stored generated mask assignment information. The combined information is to be used for forming at least one new mask.

The previously stored layout and mask assignment information that was initially stored in the layout mapping file at step 214 during the initial IC design is accessed from a computer readable storage medium by a computer for modifying the design and forming at least one new mask. All locked and unlocked mask assignments are displayed (as described above with reference to FIGS. 8(c) and 8(f)).

The mask assignment (color) reference step 216 is provided for accessing previously stored mask assignment information 1516 for forming a plurality of patterns on a layer of an integrated circuit (IC) by multipatterning. The previously stored mask assignment information includes, for each of the plurality of patterns, which of a plurality of masks A, B is to be used to form that pattern, and a mask assignment lock status for that pattern. This information is to be reused, except for specific modifications input by the user, and certain limited system generated changes to accommodate the user input modifications. Because the mask assignment reference 216 retains the lock state information, all patterns which have previously been locked by the user remain locked, minimizing the propagation of new automatically generated changes.

In FIG. 11, a step 218 is added for modifying at least one of the plurality of patterns, and determining a mask assignment thereof. The user inputs this information, for example using the processor 1522.

In step 219, the system then generates suggested mask assignments for any unlocked patterns in the vicinity of the modified pattern (i.e., patterns within the boundary 1320, described below in the discussion of FIG. 13). The identification of which unlocked patterns should have new suggested (unlocked) mask assignments generated is described below with reference to FIG. 13.

Referring again to FIG. 11, the system returns to step 208, to perform the color aware prototyping 210 and DRC/LVS/RCX 212 steps for the modified design.

This approach provides faster ECO flow. It reduces the number of patterns passing through the color decomposition step and reserves initial color decomposition properties.

In the full colored layout 208, the tool or user identifies which problems are color related rule violations (where a problem is caused by assigning one or more particular patterns to particular masks), and which are original DRC geometry violations (independent of mask assignments). Then the user can target the correct problem. Since jump 1104 provides the mask assignment reference (previously stored mask assignment and mask assignment lock state information), the system will indicate violations. This approach makes sure there are no G0-loop (sub-minimum spacing odd-loops) or risk patterns in the layout. Preserving the previously computed mask assignments and mask assignment lock states during the ECO implementation can help to reduce changes to the mask assignments and mitigate mask assignment change propagation and mask swap efforts.

FIGS. 12(a) to 12(e) show additional features that are included in the partial color assignment step 204 (of FIG. 2) in some embodiments. As shown in FIG. 12(a), in some embodiments, the partial color assignment step 204 is modified to account for design rules that are used for MPT with two or more different processes. The method selects good layout topology and assigns color anchors into the patterns/locations. Thus, the designer is guided to include topologies during the initial partial coloring step, which will reduce full coloring asymmetry issues.

In block 1202, a sub minimum design rule (G0-rule) spacing check is performed (e.g., to identify odd-loops, where an odd loop is a set of patterns having an odd number of sub-minimum spaces, as shown in FIG. 12(b). In some embodiments, high-lights are displayed to guide the designer to exclude odd loop layout topology. For example, in FIG. 12(b), boxes 1220, 1222, 1224 are displayed around the vertices representing the patterns having a (G0-rule) violation, and edges 1221, 1223, 1225 are shown connecting the vertices.

Referring again to FIG. 12(a), in some embodiments, a critical network assignment block 1204 allows the user to manually select critical networks to be grouped and assigned to one of the masks (e.g., mask A).

Once the user completes the critical net identification, the tool automatically assigns the critical nets, so in order to mitigate asymmetric process issues discussed above.

In the Risk Pattern check block 1206, a pattern match points out risk patterns (e.g. variation unfriendly patterns and performance unfriendly patterns, such as those described above with reference to FIGS. 5(a) to 5(d)), which will not be swapped. That is, mask assignments for these patterns, which have been selected and locked by the designer, will not be reversed.

In some embodiments, the risk pattern check block 1206 is configured to identify pattern combinations as shown in FIGS. 12(*c*) to 12(*e*), for the designer to resolve during partial coloring step 204. The computer automatically identifies whether one or more of the plurality of patterns is of a type that is susceptible to an asymmetric process induced defect, and automatically notifies a user about the identifying. For example, the configuration of parallel lines 1230-1232 shown in FIG. 12(*c*) can be made variation friendly by assigning pattern 1231 to the A mask, and patterns 1230, 1232 to the B mask. The patterns 1240 and 1241 in FIG. 12(*d*) can be made yield friendly by assigning the pattern 1240 to the A mask and pattern 1241 to the B mask. The patterns 1250 and 1251 in FIG. 12(*e*) can be made performance friendly by assigning pattern 1250 to the A mask and pattern 1251 to the B mask. In some embodiments, the risk pattern check block 1206 suggests these solutions for coloring the patterns shown in FIGS. 12(*c*) to 12(*e*). The user can accept these suggestions by locking the mask assignments of the patterns.

FIGS. 13(*a*) to 13(*c*) shows a method of constructing a boundary 1320 around a region 1322 which is to undergo a design change. The design change can be made to implement an ECO or to correct a DRC violation. This approach supports local color modification and swapping alone, while preserving previously colored, DRC clean portions of the layout. Assuming that DRC checks only find a violation or wishes to make a change in the "DRC violation/ECO region" 1322 of FIG. 13(*a*), the system generates a boundary 1320 around the "DRC violation/ECO region" 1322 containing at least one of the plurality of patterns. The boundary 1320 can be separated from the "DRC violation/ECO region" 1322 by a pre-determined distance, such as 3*G0 (i.e., 3 times the minimum spacing between patterns on a single mask, according to a minimum spacing design rule). Inside the boundary 1320, all shapes are specially handled.

FIG. 13(*b*) is an enlarged detail of FIG. 13(*a*). The region 1322 has a first DRC violation 1324 between the patterns 1330 and 1332, and a second DRC violation 1326 between the patterns 1332 and 1334. The region between the DRC violation/ECO region 1322 and the boundary 1320 contains other patterns (e.g., 1338) which do not have DRC violations, but their RC couplings can be affected by any changes within the DRC violation/ECO region 1322. For example, a change implementing an ECO within the DRC violation/ECO region 1322 can change the RC coupling between pattern 1338 and the pattern 1334 inside the DRC violation/ECO region 1322. The RC coupling of any pattern within the boundary 1320 (regardless of color) can be influenced by the DRC violation correction or ECO implementation within region 1322. So, all polygons and shapes in the boundary 1320, even if they do not violate DRC, will be reconsidered and their mask assignments will be unlocked. The system will generate new mask assignment information for any of the plurality of patterns that are located within the boundary and have an "unlocked" mask assignment lock state. Essentially, these patterns are optimized to account for the changes made by the DRC or ECO in the region 1322. Outside the boundary 1320, the method isolates the DRC clean polygons (e.g., 1312, 1314), which do not need to have their masks (colors) reassigned. This reduces the time and effort to implement the design change.

In some embodiments, if the region 1322 has a pattern (e.g., 1334) abutting the edge of the region 1322, the perimeter of the region 1322 is changed, so that the entire pattern 1334 is within the perimeter, as shown in FIG. 13(*c*). This ensures that the effects of the change within the region 1322 can be isolated within the boundary 1320.

The above described method de-couples the DRC violation correction from the surrounding patterns by detecting the boundary 1320. All patterns within the region between the DRC violation/ECO region 1322 and the boundary 1320 are searched, either in a counter clockwise or clockwise direction.

Because of this isolation method, during implementation of an ECO, all mask assignments (colors) outside the boundary are preserved (locked). This preserves the completed mask assignments which satisfy the DRC checks outside of the ECO region, minimizing the scope of the ECO work.

The embodiments described herein can be applied to other types of multipatterning (MPT) using more than two masks.

This approach can adopt not only double patterning, but also MPT-multiple patterning technology involving three or more masks, involving two or more different processes.

Figure 14B:
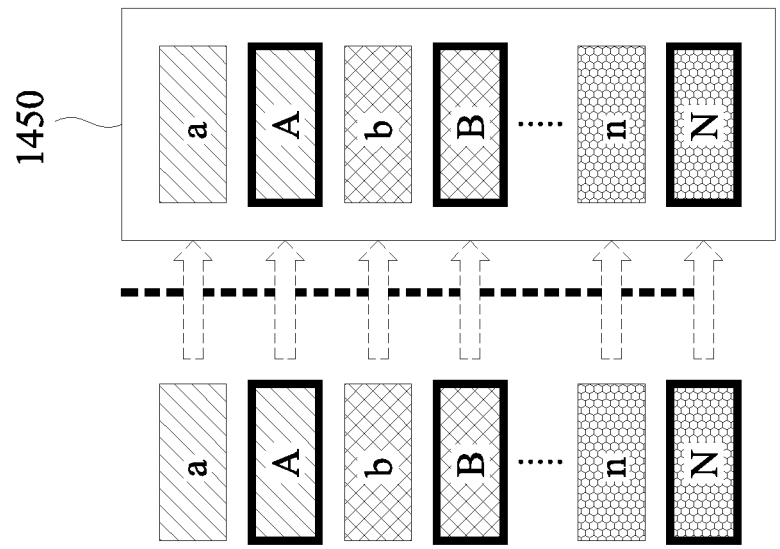
FIGS. 14(a) and 14(b) show extension of the method to multipatterning techniques using more than two masks for patterning a single layer of an IC.
Figure 14A:
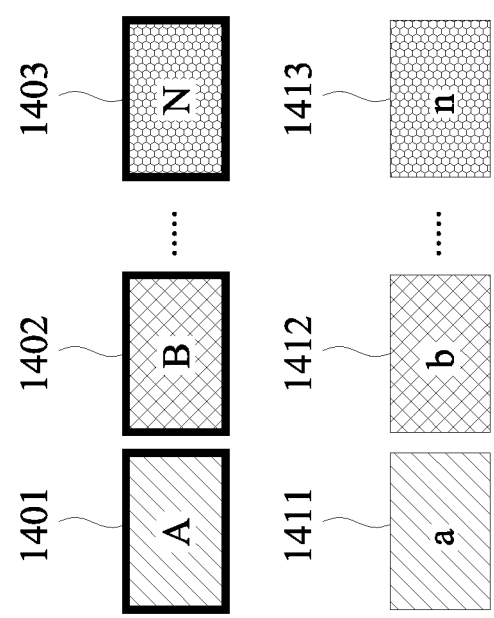

FIGS. 14(*a*) and 14(*b*) show a graphical display method for an MPT method having N masks, where N is the non-zero and non-negative integer. As shown in FIG. 14(*a*), the method can be applied to an MPT technique having N available masks. The user can assign patterns or groups of patterns to masks, and the assignments are locked and indicated by the outlined symbols 1401-1403. The remaining unassigned patterns are then automatically assigned (but not locked), and the assignments are indicated by the patterns 1411-1413 (without outline). As shown in FIG. 14(*b*), once the patterns are all assigned (either by the user or the EDA tool), the mask identification and lock status of each pattern are saved. When the user opens up the layout in the layout editor, the user can view the mask assignment indicia (fill pattern, tone, color, outlining or the like), including the lock status, as shown by the layout editor view 1450.

Figure 15:
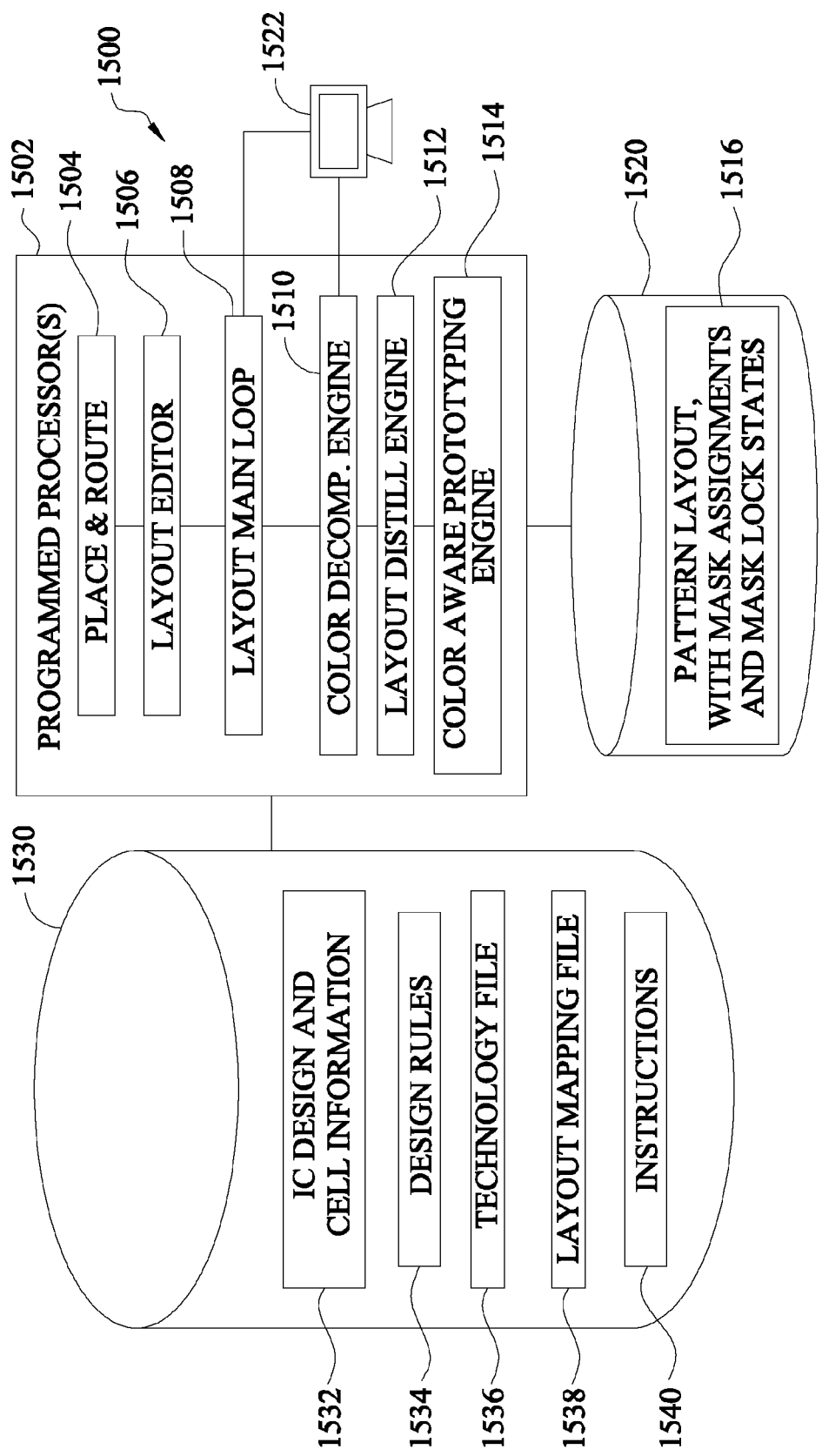
FIG. 15 is a block diagram of a system, in accordance with some embodiments.

FIG. 15 is a block diagram of an implementation of the method in an EDA tool using a programmed processor 1502, in accordance with some embodiments. The method can be run on a system 1500 including a computer processor 1502 and a non-transitory, machine-readable storage medium 1530. A user can enter input data and view displayed output data using a computer processor 1522, which can be a workstation, a desktop computer, a laptop computer, a tablet processor or other mobile device in some embodiments.

System 1500 includes an electronic design automation ("EDA") tool 1502 such as "IC COMPILER"™, sold by Synopsys, Inc. of Mountain View, Calif., which may include a place and route tool 704, such as "ZROUTE"™, also sold by Synopsys. Other EDA tools 702 may be used, such as the "VIRTUOSO"™ custom design platform or the Cadence "ENCOUNTER"® digital IC design platform may be used, along with the "VIRTUOSO" chip assembly router, all sold by Cadence Design Systems, Inc. of San Jose, Calif.

In some embodiments, EDA tool 1502 is a special purpose computer formed by retrieving stored program instructions 1540 from a non-transient computer readable storage medium 1530 and executing the instructions on a general purpose processor. Examples of non-transient computer readable storage mediums 1520, 1530 include, but are not limited to, hard disk drives (HDD), read only memories ("ROMs"), random access memories ("RAMs"), flash memories, or the like. Tangible, non-transient machine readable storage mediums 1520, 1530 are configured to store data generated by the place and route tool 1504.

The placement function of the place and route tool determines the location of individual IP blocks in the floor plan of the IC. The router of the place and route tool 1504 is capable of receiving an identification of integrated circuit ("IC") design and cell information 1532 (or interposer layout), including, for example, a netlist containing pairs of cells within the plurality of cells to be connected to each other. The router of place and route tool 1504 can be equipped with a set of default design rules 1534 and technology file 1536. The Router of tool 1504 generates the custom interconnect routing lines and vias for interconnecting the various devices of the IC.

The layout editor 1506 provides a graphical user interface for displaying part or all of a layout of one or more layers of the IC design. The layout editor can receive the GDS II output file from the place and route tool, or a GDS II representation of a previously taped out IC. In some embodiments, when the patterns of a layout are assigned to respective masks, the mask assignments and lock states of the mask assignments are stored in a layout mapping file 1538. Subsequently (e.g., when implementing an ECO), the mask assignments and lock states in the layout mapping file are provided to the layout editor 1506, so that the full colored layout can be displayed, including all mask assignments and lock states.

The main layout loop block 1508 controls the sequential performance of layout implementation 202, partial color assignment 204, color decomposition 206, full color layout generation 208, color aware prototyping 210, and DRC/LVS/RCX 212. These steps are all described above with reference to FIG. 2, and for brevity, the functions of the main loop block 1508 are not repeated.

The color decomposition block 1510 automatically generates mask assignments for any patterns which are unassigned. In some embodiments, the color decomposition block 1510 also automatically generates mask assignments for any patterns which are assigned, but have an unlocked assignment attribute.

The layout distill engine 1512 provides an abbreviated program flow (as described above with reference to FIG. 11) for generating mask assignments in a region changed by an ECO, while retaining any previously generated locked mask assignments, and providing the previously generated unlocked mask assignments for use by the color aware prototyping engine 1514. In some embodiments, these locked and unlocked mask assignments are all stored in the layout mapping file 1538. In this reduced program flow, the main loop 1102 is reduced to a shortened loop 1104, thus omitting the steps 202, 204 and 206 from the program flow of FIG. 2. A boundary is constructed around a region to be modified. The previously stored full color layout information outside of the boundary is accessed from the layout mapping file and is retained. Mask assignments are only input and/or generated (steps 204, 206) within the boundary.

The color aware prototyping engine 1514 receives the full color layout of each DRC clean IP block, and identifies the patterns at the periphery of each IP block. The color aware prototyping engine 1514 checks for MPT violations due to two adjacent patterns assigned to the same mask, and located in adjacent IP blocks, such as those shown in FIGS. 9(*a*) to 9(*d*). See, for example, patterns 910 and 912 in FIG. 9(*b*). Upon identification of an MPT violation between two adjacent patterns at the peripheries of two adjacent IP blocks 902, 904, the color aware prototyping engine 1514 checks other available IP placements, such as increasing space between IPs (FIG. 9(*c*)) or swapping the locations of the two IPs (FIG. 9(*d*)).

The fully colored layout data 1516 are then stored in the non-transitory, computer readable storage medium 1520, including, for each pattern, a respective mask assignment and a respective mask assignment lock state. Thus, in the example described above having mask A and mask B, some patterns 410 are assigned to mask A and are locked, some patterns 411 are assigned to mask B and are locked, some patterns 415 are assigned to mask A and are unlocked, some patterns 416 are assigned to mask B and are unlocked.

EDA tool 1502 indicates that one or more programmed processors may be included. In some embodiments, the processing load is performed by two or more application programs, each operating on a separate processor. In other embodiments, the processes are all performed using one processor. Similarly, two media 1520, 1530 are shown, but the data may be stored in any number of media.

Although FIG. 15 shows an allocation of the various tasks to specific modules, this is only one example. The various tasks may be assigned to different modules to improve performance, or improve the ease of programming.

As described herein, some embodiments provide a layout pre-coloring method with storage of full coloring information and lock status, and a layout editor that can access the stored coloring information for rapid implementation of post-tape-out design changes, such as in response to ECOs. The method and system further provides tools for assisting the designer in identifying critical networks and high risk patterns that should be considered as candidates for pre-coloring. The system and method also assists the designer during IP placement, to identify multi-patterning conflicts that are created by adjacent placement of two or more previously DRC-checked IP blocks. These systems and methods are advantageous in full coloring custom design methodology, such as MPT techniques that use multiple process methods for patterning the same layer (e.g., SADP). These systems can reduce analog/mixed signal design and layout implementation effort.

In some embodiments, 4 steps (FIG. 3) are used to achieve full coloring in the 10 nm technology node (or other advanced technology).

The partial color to full color step 302 identifies all patterns that have not been locked by the user, and automatically generates suggested (unlocked) mask assignments for those patterns.

The main Layout loop 304 can resolve the majority of color assignment problems including sub minimum spacing (layout geometry). The main loop incorporates design rules that can identify risky patterns for full coloring techniques using multiple processes. The main loop highlights these patterns, to allow the designer to pre-color them, to obviate the problem.

The Layout distill loop 306 provides a short cut for ECO or final layout modification. Full coloring mask assignment information generated during the initial layout coloring process can be accessed and re-used, so that the effort and time expended to implement the ECO is minimized.

Color aware prototyping 308 avoids induced DRC violations due to placement of IP blocks and reduces turn-around time. Color aware prototyping can detect violations that occur due to the proximal placement of two or more IP blocks, after the individual IP blocks have already passed through DRC checks.

In some embodiments, a non-transitory, computer readable storage medium is encoded with computer program instructions, such that, when the computer program instructions are executed by a computer, the computer performs a method. The method generates mask assignment information for forming a plurality of patterns on a layer of an integrated circuit (IC) by multipatterning. The mask assignment information includes, for each of the plurality of patterns, a mask assignment identifying which of a plurality of masks is to be used to form that pattern, and a mask assignment lock state for that pattern. User inputs setting the mask assignment of at least one of the plurality of patterns, and its mask assignment lock state are received. A new mask assignment is generated for each of the plurality of patterns having an "unlocked" mask assignment lock state.

In some embodiments, a method comprises accessing previously stored mask assignment information for forming a plurality of patterns on a layer of an integrated circuit (IC) by multipatterning. The mask assignment information includes, for each of the plurality of patterns, which of a plurality of masks is to be used to form that pattern, and a mask assignment lock status for that pattern. At least one of the plurality of patterns is modified, and a mask assignment thereof is determined. The previously stored mask assignment information for at least one other one of the plurality of patterns and the mask assignment of the modified pattern are stored in a computer readable storage medium that is accessible by a computer for forming at least one new mask.

In some embodiments, an electronic design automation (EDA) tool comprises a non-transitory computer readable storage medium containing internal layout information and mask assignment information for first and second circuit blocks of an integrated circuit (IC). The IC has at least one layer to be formed by multipatterning with at least two masks. A computer is configured for placing the first and second circuit blocks in a floorplan of the IC. The computer is configured to access the internal layout information and mask assignment information. The computer is configured to identify whether a first pattern in the first circuit block and a second pattern in the second circuit block are assigned to a same one of the at least two masks and are separated from each other by a distance that is smaller than a predetermined minimum spacing design rule after the placing.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that the computer becomes a special purpose apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods. Although the subject matter has been described in terms of exemplary embodiments, it is not limited thereto. Rather, the appended claims should be construed broadly, to include other variants and embodiments, which may be made by those skilled in the art.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   generating mask assignment information for forming a plurality of patterns on a layer of an integrated circuit (IC) by multipatterning, the mask assignment information including, for each of the plurality of patterns, a mask assignment identifying which of a plurality of masks is to be used to form that pattern, and a mask assignment lock state for that pattern;
   receiving user inputs setting the mask assignment of at least one of the plurality of patterns, and at least one mask assignment lock state of at least one pattern having a respective mask assignment, including allowing the user to set a mask assignment lock state of a pattern having a mask assignment to a locked state and allowing the user to set the mask assignment lock state of the pattern having the mask assignment to an unlocked state; and
   generating a new mask assignment for each of the plurality of patterns having an "unlocked" mask assignment lock state.

2. The method of claim 1, wherein the step of generating the new mask assignment excludes generating a new mask assignment for each of the plurality of patterns having a "locked" mask assignment lock state.

3. The method of claim 1, further comprising:
   automatically identifying, by the computer, whether one or more of the plurality of patterns is of a type that is susceptible to an asymmetric process induced defect; and
   automatically notifying a user about the identifying.

4. The method of claim 3, further comprising notifying the user of a suggested mask assignment for the one or more of the plurality of patterns to avoid the asymmetric process induced defect.

5. The method of claim 1, further comprising:
   storing the user inputs and the generated mask assignment information in a computer readable storage medium that is accessible by a computer for forming the plurality of masks.

6. The method of claim 5, further comprising:
   receiving additional user inputs modifying at least one of the plurality of patterns, and setting a mask assignment thereof; and
   combining the mask assignment of the modified pattern with a subset of the stored user inputs and a subset of the stored generated mask assignment information for forming at least one new mask.

7. The method of claim 6, further comprising:
   generating a boundary around the at least one of the plurality of patterns;
   generating new mask assignment information for any of the plurality of patterns that are located within the boundary and have an "unlocked" mask assignment lock state.

8. A non-transitory, computer readable storage medium encoded with computer program instructions, such that, when the computer program instructions are executed by a computer, the computer performs a method comprising:
   accessing previously stored mask assignment information of a previously taped-out integrated circuit (IC) layout for forming a plurality of patterns on a layer of an IC by multipatterning, the previously stored mask assignment information including, for each of the plurality of patterns, which of a plurality of masks is to be used to form that pattern, and a mask assignment lock state for that pattern, at least one of the plurality of patterns having a mask assignment lock state that is locked, at least one of the plurality of patterns having a mask assignment lock state that is unlocked;

modifying at least one of the plurality of patterns, and determining a mask assignment thereof; and storing the previously stored mask assignment information for at least one other one of the plurality of patterns, and the mask assignment of the modified pattern, in a computer readable storage medium that is accessible by a computer for forming at least one new mask.

9. The non-transitory, computer readable storage medium of claim 8, wherein the at least one new mask is to be used in a multipatterning technique that uses respectively different processes for patterning a single layer of the IC with at least two masks.

10. The non-transitory, computer readable storage medium of claim 9, wherein the method further comprises:

automatically identifying, by a computer, whether one or more of the plurality of patterns is of a type that is susceptible to an asymmetric process induced defect; and automatically notifying a user about the identifying.

11. The non-transitory, computer readable storage medium of claim 10, wherein the method further comprises:

notifying the user of a suggested mask assignment for the one or more of the plurality of patterns to avoid the asymmetric process induced defect.

12. The non-transitory, computer readable storage medium of claim 8, wherein the method further comprises:

automatically generating a suggested mask assignment for each of the plurality of patterns; and automatically setting the mask assignment lock status for each suggested mask assignment to an unlocked state.

13. The non-transitory, computer readable storage medium of claim 12, wherein the method further comprises:

receiving a command from a user to set the mask assignment lock status of at least one of the plurality of patterns to a locked state.

14. The non-transitory, computer readable storage medium of claim 13, wherein the method further comprises automatically generating a new suggested mask assignment for each of the plurality of patterns for which the mask assignment lock status has not been set to the locked state.

15. An electronic design automation (EDA) tool, comprising:

a non-transitory computer readable storage medium containing internal layout information and mask assignment information for first and second circuit blocks of an integrated circuit (IC), the IC having at least one layer to be formed by multipatterning with at least two masks;

a computer configured for placing the first and second circuit blocks in a floorplan of the IC, the computer configured to access the internal layout information and mask assignment information;

wherein the computer is configured to identify whether a first pattern in the first circuit block and a second pattern in the second circuit block are assigned to a same one of the at least two masks and are separated from each other by a distance that is smaller than a predetermined minimum spacing design rule after the placing, and the computer is configured to modify a placement by moving the second circuit block from a first side of the first circuit block to a second side of the first circuit block, so that a separation between a third pattern in the first circuit block, nearest to the second circuit block, and a fourth pattern in the second circuit block, nearest the first circuit block, satisfies the minimum spacing design rule.

16. The EDA tool of claim 15, wherein the computer is configured for increasing a separation between the first and second circuit blocks, so that a separation between the first and second patterns satisfies the minimum spacing design rule.

17. The EDA tool of claim 15, wherein the computer is configured to insert dummy patterns adjacent to at least one of the first circuit block or the second circuit block so that a ratio of total patterned area to total IC area in the layer is at least a predetermined value.

18. The EDA tool of claim 17, wherein the computer is further configured to determine a first total area of patterns assigned to a first mask of the at least two masks and a second total area of patterns assigned to a second mask of the at least two masks, and to assign the dummy patterns to at least one of the first or second mask so as to maintain a percentage difference between the first and second total areas below a predetermined threshold value.

19. The EDA tool of claim 15, wherein the computer is configured to maintain at least a first predetermined keep-out space between the first and second patterns if the first and second patterns are assigned to the same mask, and a second predetermined keep-out space between the first and second patterns if the first and second patterns are assigned to different masks from each other.

* * * * *